United States Patent
Fukuzumi et al.

(10) Patent No.: US 10,070,529 B2
(45) Date of Patent: Sep. 4, 2018

(54) ELECTRONIC CIRCUIT DEVICE

(71) Applicant: Mitsubishi Electric Corporation, Tokyo (JP)

(72) Inventors: Eitaro Fukuzumi, Tokyo (JP); Mitsunori Nishida, Tokyo (JP); Muneyuki Ooshima, Tokyo (JP)

(73) Assignee: Mitsubishi Electric Corporation, Chiyoda-ku, Tokyo (JP)

(*) Notice: Subject to any disclaimer, the term of this patent is extended or adjusted under 35 U.S.C. 154(b) by 27 days.

(21) Appl. No.: 15/229,409

(22) Filed: Aug. 5, 2016

(65) Prior Publication Data

US 2017/0208689 A1 Jul. 20, 2017

(30) Foreign Application Priority Data

Jan. 14, 2016 (JP) .................................. 2016-005112

(51) Int. Cl.
*H05K 7/10* (2006.01)
*H05K 7/12* (2006.01)
(Continued)

(52) U.S. Cl.
CPC ............. *H05K 1/181* (2013.01); *H01L 24/17* (2013.01); *H01L 25/072* (2013.01);
(Continued)

(58) Field of Classification Search
CPC ........... H01L 2224/16227; H01L 24/17; H01L 25/072; H01L 2924/1203;
(Continued)

(56) References Cited

U.S. PATENT DOCUMENTS 7,300,850 B2 * 11/2007 Grivna .............. H01L 21/28525
257/197
7,482,220 B2 * 1/2009 Loechelt ............... H01L 21/761
257/328
(Continued)

FOREIGN PATENT DOCUMENTS

JP 11-145198 A 5/1999
JP 2001-156432 A 6/2001
(Continued)

OTHER PUBLICATIONS

Communication dated Dec. 13, 2016 by the Japanese Patent Office in counterpart Japanese Patent Application No. 2016-005112.

*Primary Examiner* — Yuriy Semenenko
(74) *Attorney, Agent, or Firm* — Sughrue Mion, PLLC; Richard C. Turner

(57) ABSTRACT

A surface-mount component (10A) having a pair of connection terminals (12a, 12b) with an inter-terminal pitch L2 therebetween is mounted on a circuit substrate (20A) having a pair of electrode pads (22a, 22b) with an inter-electrode pitch L1 therebetween (L2>L1). Standard position indication marks (23) are formed on the circuit substrate (20A). When heating is performed under a state in which solder non-wetting of the left electrode pad (22a) occurs, the solder applied to the right electrode pad (22b) solder connects the right electrode pad (22b) and the connection terminal (12b), and the surface-mount component (10A) is attracted to the left and is offset or displaced from the standard position indication marks (23) by an offset dimension δ7. If the solder is applied to the left and right electrode pads (22a, 22b), there is no offset dimension.

22 Claims, 10 Drawing Sheets

(51) Int. Cl.
  *H05K 1/18* (2006.01)
  *H01L 23/00* (2006.01)
  *H01L 25/07* (2006.01)
  *H05K 1/09* (2006.01)
  *H05K 1/02* (2006.01)
  *H05K 3/34* (2006.01)
  *H05K 1/11* (2006.01)

(52) U.S. Cl.
  CPC ............ *H05K 1/0269* (2013.01); *H05K 1/09* (2013.01); *H05K 3/3431* (2013.01); *H01L 2224/16227* (2013.01); *H01L 2924/1203* (2013.01); *H01L 2924/1306* (2013.01); *H05K 1/111* (2013.01); *H05K 3/3436* (2013.01); *H05K 2201/09918* (2013.01); *H05K 2201/09936* (2013.01); *H05K 2201/10166* (2013.01); *H05K 2201/10174* (2013.01); *H05K 2203/048* (2013.01); *Y02P 70/613* (2015.11)

(58) Field of Classification Search
  CPC .......... H01L 2924/1306; H05K 1/0269; H05K 1/09; H05K 1/111; H05K 1/181; H05K 2201/09918; H05K 2201/09936; H05K 2201/10166; H05K 2201/10174
  See application file for complete search history.

(56) References Cited

U.S. PATENT DOCUMENTS

| | | | |
|---|---|---|---|
| 9,029,946 B2 * | 5/2015 | Davies | H01L 21/76224 257/341 |
| 2007/0000684 A1 * | 1/2007 | Harada | H05K 1/0269 174/250 |
| 2007/0257708 A1 * | 11/2007 | Shimokawa | H01L 21/565 327/5 |
| 2010/0059875 A1 * | 3/2010 | Sato | H01L 23/4952 257/690 |

FOREIGN PATENT DOCUMENTS

| | | | |
|---|---|---|---|
| JP | 2001156432 | * | 7/2001 |
| JP | 2002-353578 A | | 12/2002 |
| JP | 2002353578 | * | 12/2002 |
| JP | 2007-012771 A | | 1/2007 |

* cited by examiner

ELECTRONIC CIRCUIT DEVICE

BACKGROUND OF THE INVENTION

1. Field of the Invention

The present invention relates to an electronic circuit device in which small surface-mount components are densely mounted on a circuit substrate using lead-free solder with deteriorated solder wettability and which is improved so as to prevent occurrence of soldering defects.

2. Description of the Related Art

In a solder connection between a connection terminal formed on a surface-mount component side and an electrode pad formed on a circuit substrate side, as the area of the electrode pad becomes smaller as the surface-mount component becomes smaller, it becomes more difficult for solder paste to be squeezed through openings in a metal mask onto the surface of the electrode pad, and a soldering defect may occur due to solder non-wetting phenomena on the electrode pad.

However, in the case of a small component in which the connection terminal is formed on aback surface of the surface-mount component to reduce the footprint thereof, it is difficult to detect the soldering defect.

With reference to FIG. 2 of Japanese Patent Application Laid-open No. 2002-353578 "SUBSTRATE FOR SURFACE-MOUNT COMPONENT AND METHOD OF MOUNTING THE SURFACE-MOUNT COMPONENT ON SUBSTRATE", mounting position indication marks 14 indicating a normal mounting position A and misregistration indication marks 15 are formed at diagonal positions of a surface-mount component 1 mounted on a substrate 11. The surface-mount component 1 is adapted to be solder joined through molten solder balls 3 under a state of being mounted on the substrate 11 and being positioned with respect to one of the misregistration indication marks 15.

As a result, in the case of appropriate soldering, the surface-mount component 1 is normally moved to a position defined by the mounting position indication marks 14 by a self-alignment action. However, in the case of an unmolten solder material or insufficient wetting, the surface-mount component 1 does not move to the position defined by the mounting position indication marks 14 as the normal mounting position A, which can be visually detected.

Further, in FIG. 14 and paragraphs [0041] to [0043] of Japanese Patent Application Laid-open No. 2002-353578, there is disclosed that not the solder balls 3 (see FIG. 2) but the cream solder 16' is applied to the surface-mount component 1, the misregistration indication marks 15 are displaced by substantially a half of a diameter L1 of a component-side electrode 2, and the component-side electrodes 2 and substrate-side electrodes 13 may be formed substantially in the shape of a circle or in the shape of a polygon such as a rectangle.

A "method of mounting a surface-mount component" in Japanese Patent Application Laid-open No. 2002-353578 can detect whether or not there are soldering defects at many electrode portions due to, for example, unsatisfactory temperature control in soldering in a large surface-mount component having a large number of electrodes, but is not appropriate for detecting a soldering defect with regard to one electrode among a large number of electrodes.

Further, even if a case is assumed in which the concept given here is applied to a surface-mount component having a small number of electrodes, when solder non-wetting in which solder is not applied to one connection surface occurs, the self-alignment effect acting on other connection surfaces can move the surface-mount component to an appropriate mounting position (because the inter-electrode pitch is the same between the component side and the substrate side), and thus, there is a problem that the state cannot be detected as a failure.

Further, the surface-mount component is intentionally mounted at an offset or displaced position, and thus, when the self-alignment effect does not act satisfactorily, a state occurs in which the item is determined to be non-defective but the surface-mount component is not mounted at an ideal position. There is a problem of a potential deterioration over time.

SUMMARY OF THE INVENTION

It is accordingly an object of the present invention to provide an electronic circuit device including two to four connection terminals that are formed on a back surface of a surface-mount component and two to four electrode pads that are formed on a circuit substrate correspondingly thereto and adapted to be solder connected thereto, respectively, and being capable of detecting solder non-wetting state in which a solder material is not applied to a solder surface.

An electronic circuit device according to the present invention comprises: a plurality of electrode pads formed on a front surface of a circuit substrate; and a plurality of connection terminals formed as many as the plurality of electrode pads on a back surface of a surface-mount component, the plurality of electrode pads and the plurality of connection terminals being connected with heated solder, respectively, wherein the solder comprises lead-free solder having a lead content of 0.1% or less in mass ratio, wherein the plurality of connection terminals are not formed on a side end surface and on a front surface of the surface-mount component and are formed on the back surface of the surface-mount component to be opposed to the front surface of the circuit substrate, wherein a component mount surface which is the front surface of the circuit substrate has standard position indication marks formed thereon at least at diagonal positions of the surface-mount component, wherein the standard position indication marks indicate a contour position of the surface-mount component as a reference relative position where the plurality of connection terminals are mounted at central positions of the plurality of electrode pads, respectively, and wherein in order that, when a part of the solder applied to the plurality of electrode pads is lacked and solder non-wetting state of one of a pair of electrode pads among the plurality of electrode pads occurs, an actual contour position of the surface-mount component becomes different from the contour position indicated by the standard position indication marks, one of a horizontal inter-electrode pitch and a vertical inter-electrode pitch of the plurality of electrode pads is smaller than corresponding one of a horizontal inter-terminal pitch and a vertical inter-terminal pitch of the plurality of connection terminals.

As described above, in the electronic circuit device according to the present invention, the circuit substrate with the surface-mount component has the inter-electrode pitch on the substrate side that is smaller than the inter-terminal pitch of the surface-mount component having the plurality of back surface terminals, the circuit substrate and the surface-mount component being solder connected to each other, and the standard position indication marks are formed on the substrate surface at positions corresponding to a contour position of the surface-mount component.

Therefore, the electrode pads on the circuit substrate side are confined within a back surface position corresponding to the contour position of the surface-mount component to enable miniaturization design. On the other hand, an electrode area and a wiring pattern area connecting thereto become smaller to reduce the opening area of the metal mask having the openings for applying the solder therethrough. A problem arises that the possibility of solder non-wetting occurred due to a transfer failure of the solder increases.

However, in the occurrence of such solder non-wetting, at the time of performing the soldering, the mounted component is attracted from a non-wetted terminal side to a normal terminal side by the self-alignment effect, and the surface-mount component is to be settled at a position off the standard position indication marks. This can be determined by visual observation or by image recognition using an electronic camera to enable corrections of a defective item and removal of solder that remains in the openings in the metal mask in a clogging state.

Therefore, it is effective that a small circuit substrate can be obtained and can be put to practical use, which is designed to have a high density without an outflow of a defective item by using lead-free solder with deteriorated solder wettability.

Further, the following effects are obtained. When solder non-wetting state does not occur but the mounting position of the surface-mount component varies, the surface-mount component is moved to the standard position by the self-alignment effect. The connection terminals are not formed on the end surfaces of the side portions of the surface-mount component. Thus, occurrence of a rise phenomenon thereof can be prevented. When the movement to the standard position does not occur or abnormal rise of the surface-mount component occurs even if solder non-wetting state does not occur, the surface-mount component after the solder is heated is at a position off the standard position indication mark, which can be determined by visual observation or by image recognition using an electronic camera to enable prevention of an outflow of a defective item.

DETAILED DESCRIPTION OF THE EMBODIMENTS

Embodiment 1

(1) Detailed Description of Structure

The structure of an electronic circuit device according to Embodiment 1 of the present invention will be described below with reference to FIG. 1 as a back view of a surface-mount component according to Embodiment 1 of the present invention, FIG. 2 as a plan view of a circuit substrate according to Embodiment 1 of the present invention, and FIG. 3 as a sectional view of the circuit substrate taken along the line III-III of FIG. 2.

Figure 1:
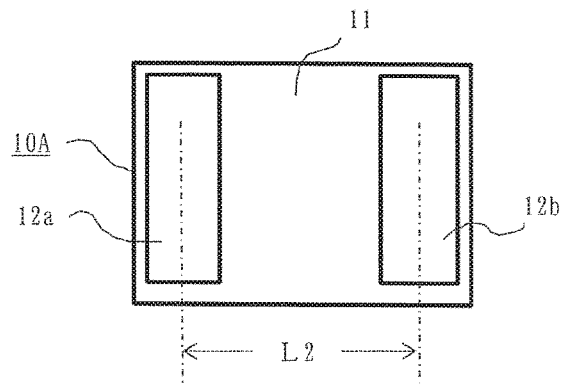
FIG. 1 is a back view of a surface-mount component according to Embodiment 1 of the present invention.

First, with reference to FIG. 1, a surface-mount component 10A is formed by, for example, arranging a power diode on a rectangular ceramic substrate (not shown) and applying a cladding material 11 as a moisture-proof coating material. As illustrated in FIG. 1, a pair of rectangular connection terminals 12a and 12b are exposed on a back surface of the surface-mount component 10A with an inter-terminal pitch L2 between center lines thereof.

Figure 2:
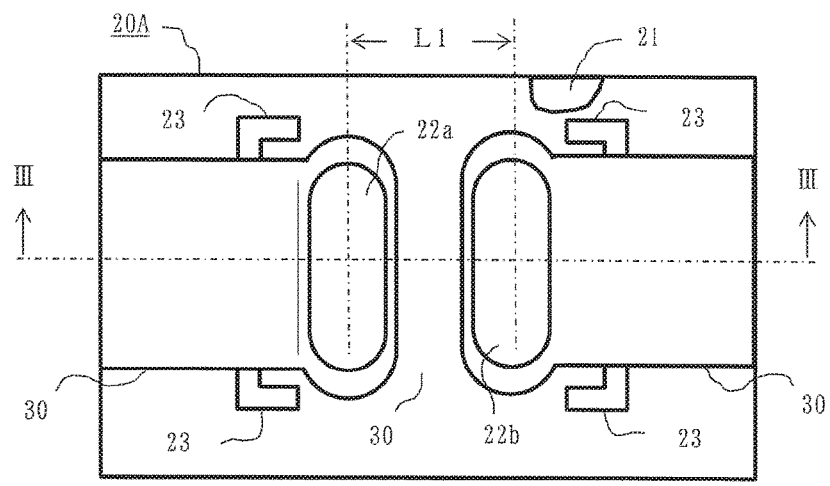
FIG. 2 is a plan view of a circuit substrate according to Embodiment 1 of the present invention.

Next, with reference to FIG. 2, a pair of electrode pads 22a and 22b are arranged on a front surface of a circuit substrate 20A housed in a housing (not shown) with an inter-electrode pitch L1 between center lines thereof. The electrode pads 22a and 22b form ends of copper foil patterns 26a and 26b, respectively, that will be described below with reference to FIG. 3, and other ends of the copper foil patterns 26a and 26b are adapted to be connected to other circuit components (not shown) that are mounted on the circuit substrate 20A.

An entire area resist film 25 is applied to substantially an entire surface of a base surface 21 of the circuit substrate 20A. Solder resist films 24a and 24b as part of the entire area resist film 25 are applied to portions around contours of the electrode pads 22*a* and 22*b* and surfaces of the copper foil patterns 26*a* and 26*b*, respectively, so that solder does not attach thereto.

The entire area resist film 25 and the solder resist films 24*a* and 24*b* are illustrated as separate elements for the sake of convenience of illustration in the drawings, but are, in reality, the same thing formed of the same material without distinction, and are applied to the front surface of the circuit substrate 20A in the same step.

Further, standard position indication marks 23 formed on the front surface of the circuit substrate 20A indicate a reference mounting position of the surface-mount component 10A. The base surface is exposed in the shape of hooks at positions corresponding to four corners of the surface-mount component 10A, and can be visually observed as the standard position indication marks 23 against the entire area resist film 25 of a different color.

Besides, the standard position indication marks 23 may be, for example, formed by silk printing in white in the shape of hooks.

Figure 3:
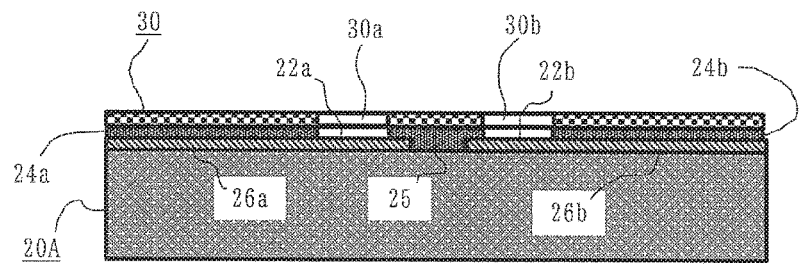
FIG. 3 is a sectional view of the circuit substrate taken along the line III-III of FIG. 2.

Next, with reference to FIG. 3 as a sectional view taken along the line III-III of FIG. 2, the pair of electrode pads 22*a* and 22*b* connecting to the copper foil patterns 26*a* and 26*b*, respectively, are formed by etching on the front surface of the circuit substrate 20A of, for example, a glass epoxy material.

Further, the solder resist films 24*a* and 24*b* cover the portions around the contours of the pair of electrode pads 22*a* and 22*b* and the surfaces of the copper foil patterns 26*a* and 26*b*, respectively, and contour center portions of the pair of electrode pads 22*a* and 22*b* form exposed surfaces.

A metal mask 30 is mounted on the front surface of the circuit substrate 20A having the solder resist films 24*a* and 24*b* applied thereto. The metal mask 30 has openings 30*a* and 30*b* formed therein at positions opposed to the contour center portions of the pair of electrode pads 22*a* and 22*b*, respectively.

When solder material paste is squeezed with a squeegee (spatula) from an outer surface side of the metal mask 30, the solder material is applied into the openings 30*a* and 30*b*. The volume of the applied solder material at this time corresponds to a product of a depth dimension, which is the sum of the thickness dimension of the metal mask 30 and the thickness dimension of the solder resist films 24*a* and 24*b*, and the areas of the openings 30*a* and 30*b*, that is, the areas of the exposed portions of the electrode pads 22*a* and 22*b*.

Next, description will be made with reference to FIG. 4 as a sectional view of the electronic circuit device in a normal case according to Embodiment 1 of the present invention, and FIG. 5 as a sectional view similar to FIG. 4 of the electronic circuit device in a case of a soldering defect.

Figure 4:
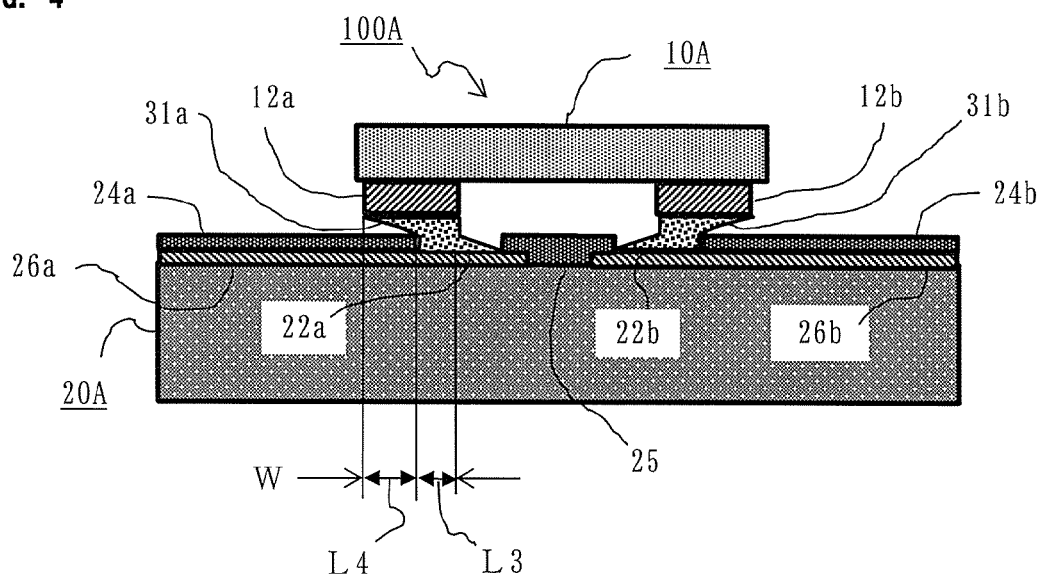
FIG. 4 is a sectional view of an electronic circuit device in a normal case according to Embodiment 1 of the present invention.

With reference to FIG. 4, the surface-mount component 10A is mounted on the circuit substrate 20A at an appropriate position. Through heating of solders 31*a* and 31*b* applied to the electrode pads 22*a* and 22*b*, respectively, in FIG. 3, the surface-mount component 10A and the circuit substrate 20A are integrated to form an electronic circuit device 100A.

The solders 31*a* and 31*b* are illustrated as being in a state of cooled and solidified after being heated and molten. The solders applied to the entire exposed surfaces of the electrode pads 22*a* and 22*b* are spread over entire surfaces of the offset connection terminals 12*a* and 12*b*, respectively.

At this time, a sum W of an overlapping dimension L3, which is the width of portions at which the left and right electrode pads 22*a* and 22*b* as well as the left and right connection terminals 12*a* and 12*b* mutually overlap, and a non-overlapping dimension L4, which is the width of non-overlapping portions, that is, L3+L4, is equal to a width W of the connection terminals 12*a* and 12*b*.

Further, the inter-terminal pitch L2 and the inter-electrode pitch L1 illustrated in FIG. 1 and FIG. 2 have the relationship of L2=L1+2×L3.

Therefore, the relationship of L3=(L2−L1)/2 holds, where L3 is the overlapping dimension. As design values, the overlapping dimension L3 and the non-overlapping dimension L4 are equal to each other, and all of the width W=L3+L4 of the connection terminals 12*a* and 12*b* and the width W of the electrode pads 22*a* and 22*b* are of the same value.

Figure 5:
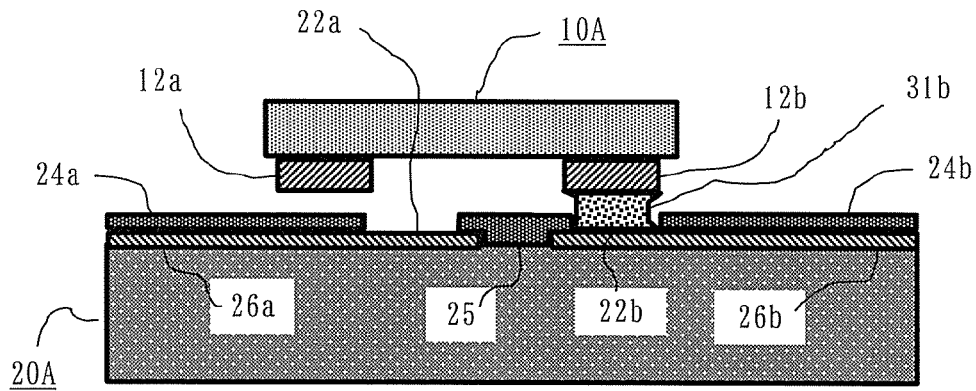
FIG. 5 is a sectional view similar to FIG. 4 of the electronic circuit device in a case of a soldering defect.

FIG. 5 is a sectional view of the electronic circuit device 100A in a case in which heat processing is performed under a state in which the solder material is applied to the right electrode pad 22*b*, but is not applied to the left electrode pad 22*a*. In this case, by a self-alignment action due to surface tension acting on the molten solder, a center position of the right electrode pad 22*b* and a center position of the connection terminal 12*b* are spatially coincident with each other. As a result, a connected position of the surface-mount component 10A after the soldering is moved to the left with respect to the position defined by the standard position indication marks 23, with an offset dimension δ of W/2, where W is the electrode width of the electrode pad 22*b*.

(2) Detailed Description of Operation

Next, local action of soldering of the electronic circuit device 100A structured as illustrated in FIG. 4 will be described in detail with reference to FIG. 6A, FIG. 6B, FIG. 7A, and FIG. 7B.

Figure 6A:
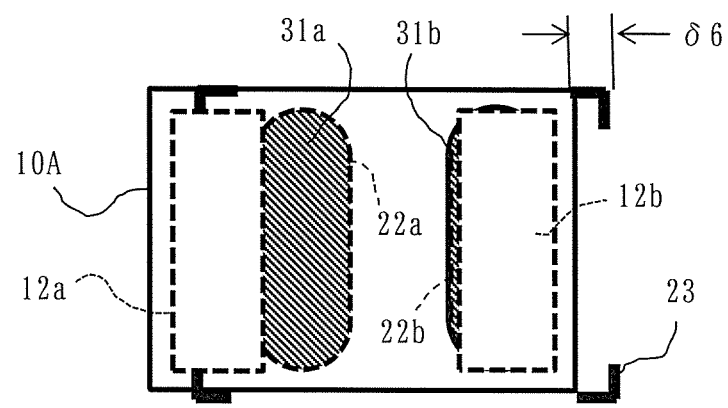
FIG. 6A is a plan view in phantom before soldering of the electronic circuit device illustrated in FIG. 4, where parts are defectively set.
Figure 6B:
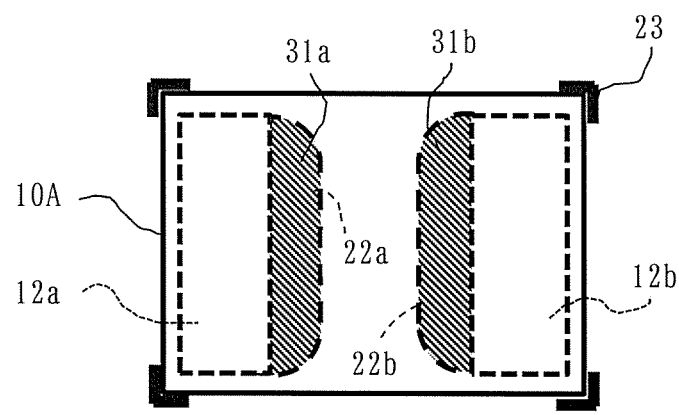
FIG. 6B is a plan view in phantom after soldering of the electronic circuit device in FIG. 6A.
Figure 7A:
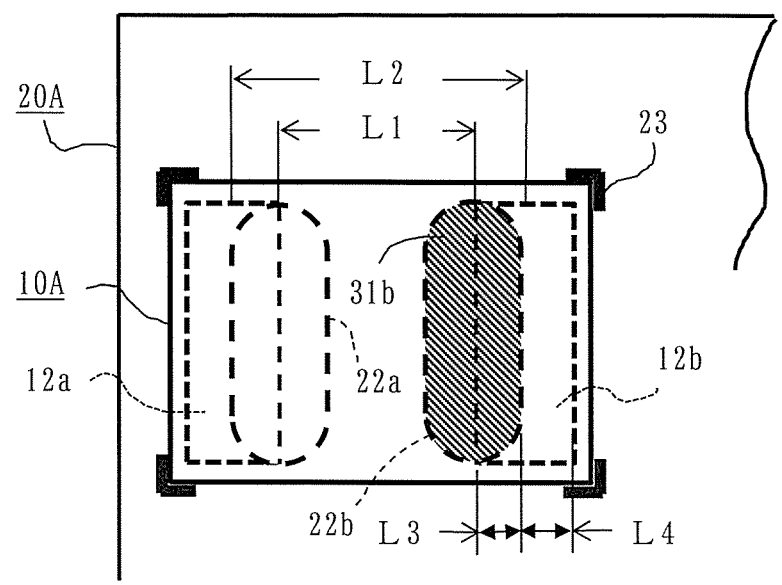
FIG. 7A is a plan view in phantom before soldering of the electronic circuit device in solder non-wetting state in FIG. 5, where parts are normally set.
Figure 7B:
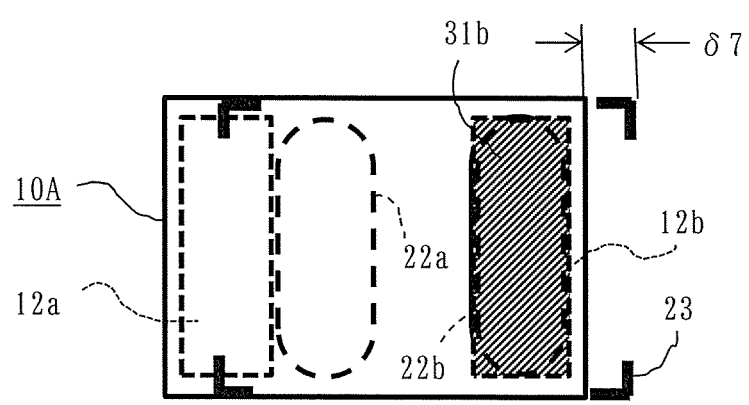
FIG. 7B is a plan view in phantom after soldering of the electronic circuit device in FIG. 7A.

FIG. 6A is a plan view in phantom before soldering of the electronic circuit device illustrated in FIG. 4, where parts are defectively set; FIG. 6B is a plan view in phantom after soldering of the electronic circuit device in FIG. 6A; FIG. 7A is a plan view in phantom before soldering of the electronic circuit device in solder non-wetting state in FIG. 5, where parts are normally set; and FIG. 7B is a plan view in phantom after soldering of the electronic circuit device in FIG. 7A.

First, as a process of fabricating the electronic circuit device 100A, as illustrated in FIG. 3, the metal mask 30 is mounted on the circuit substrate 20A illustrated in FIG. 2, and the solder material paste is squeezed and applied through the openings 30*a* and 30*b*. Then, under a state in which the metal mask 30 is removed, the surface-mount component 10A illustrated in FIG. 1 and other circuit components (not shown) are mounted on the circuit substrate 20A. After that, the entire circuit substrate 20A with the components mounted thereon is preheated, heated, and cooled to make solder connection.

FIG. 6A is an illustration of a state in which the solder material is correctly applied to the left and right electrode pads 22*a* and 22*b*, the mounting position of the surface-mount component 10A has an error, and the surface-mount component 10A is mounted at a position that is offset or displaced to the left from the standard position indication marks 23 by an offset dimension δ6 that is smaller than W/2.

Therefore, the overlapping dimension between the right electrode pad 22*b* and the connection terminal 12*b* is close to a maximum value, and the overlapping dimension between the left electrode pad 22*a* and the connection terminal 12*a* is close to a minimum value.

FIG. 6B is an illustration of a state after heat processing of the entire circuit substrate 20A in the state illustrated in FIG. 6A is performed. Surface tension of the solder material that is applied to the left and right electrode pads 22*a* and 22*b* moves the surface-mount component 10A to the right and settles the surface-mount component 10A at the predetermined position defined by the standard position indication marks 23.

As described above, for movement toward the center by the self-alignment effect, it is important that, when the overlapping dimension of one electrode portion is at the maximum, at least a minimum overlapping dimension is left for the another electrode portion.

FIG. 7A is an illustration of a state in which, although the surface-mount component 10A is mounted at an appropriate position on the circuit substrate 20A, the solder is not applied to the left electrode pad 22a, but is applied only to the right electrode pad 22b.

FIG. 7B is an illustration of a state after heat processing of the entire circuit substrate 20A in the state illustrated in FIG. 7A is performed. Surface tension of the solder material that is applied to the right electrode pad 22b moves the surface-mount component 10A to the left, and the surface-mount component 10A is offset from the predetermined position defined by the standard position indication marks 23 by an offset dimension δ7 that is equal to W/2.

With regard to the offset dimension δ7, whether or not there is abnormality can be determined by visual observation or by display analysis of an image taken by an electronic camera (not shown). This enables monitoring of the state of solder connection on the back surface side of the surface-mount component 10A that cannot be visually observed.

The connection terminals 12a and 12b are formed on the back surface of the surface-mount component 10A and are not extended to end surfaces of side portions thereof, and thus, even if the component is mounted at a position to lack in balance, a rise phenomenon (also popularly known as Manhattan phenomenon or tombstone phenomenon) of the mounted component is less liable to occur.

Further, each of the electrode pads 22a and 22b is in the shape of a modified narrow rectangle, and has a longitudinal dimension (vertical dimension in FIG. 6A) that is larger than the electrode width (horizontal dimension in FIG. 6A). Thus, compared with a case in which circular electrodes are used, a sideways slide or a roll between the solder material and the connection terminals is less liable to occur to stabilize the mounting position of the surface-mount component 10A.

The same applies to Embodiments 2 and 3 of the present invention. In Embodiments 2 and 3, even though circular electrode pads are used, a plurality of electrode pads as a whole support the surface-mount component with stability.
(3) Gist and Features of Embodiment 1

As apparent from the above description, the electronic circuit device according to Embodiment 1 of the present invention is the electronic circuit device 100A, including:

the plurality of electrode pads 22a and 22b formed on the front surface of the circuit substrate 20A; and the plurality of connection terminals 12a and 12b formed as many as the plurality of electrode pads 22a and 22b on the back surface of the surface-mount component 10A, the plurality of electrode pads 22a and 22b and the plurality of connection terminals 12a and 12b being connected with heated solders 31a and 31b, respectively, in which the solders 31a and 31b are lead-free solder having a lead content of 0.1% or less in mass ratio, in which the plurality of connection terminals 12a and 12b are not formed on the end surface of the side portion and on the front surface of the surface-mount component 10A and are formed on the back surface of the surface-mount component 10A to be opposed to the front surface of the circuit substrate 20A, in which a component mount surface which is the front surface of the circuit substrate 20A has the standard position indication marks 23 formed thereon at least at diagonal positions of the surface-mount component 10A, in which the standard position indication marks 23 indicate a contour position of the surface-mount component 10A at a reference relative position where the plurality of connection terminals 12a and 12b are mounted at central positions of the plurality of electrode pads 22a and 22b, respectively, and in which in order that when a part of the solders 31a and 31b applied to the plurality of electrode pads 22a and 22b is lacked and solder non-wetting state of one of a pair of electrode pads among the plurality of electrode pads 22a and 22b occurs, an actual contour position of the surface-mount component 10A becomes different from the contour position indicated by the standard position indication marks 23, a horizontal inter-electrode pitch L1 of the plurality of electrode pads 22a and 22b is smaller than a horizontal inter-terminal pitch L2 of the plurality of connection terminals 12a and 12b.

When the surface-mount component 10A is mounted at the reference relative position, the overlapping dimension L3 that is a width of portions at which the plurality of electrode pads 22a and 22b and the plurality of connection terminals 12a and 12b mutually overlap, is equal to or larger than at least the thickness dimension of the plurality of electrode pads 22a and 22b, and the non-overlapping dimension L4 that is a width of portions at which the plurality of electrode pads 22a and 22b and the plurality of offset connection terminals 12a and 12b do not mutually overlap, is larger than a minimum indication line width of the standard position indication marks 23 capable of being visually recognized.

The overlapping dimension L3 is a requirement for the solders 31a and 31b applied to the plurality of electrode pads 22a and 22b to be connected to the plurality of connection terminals 12a and 12b and to be molten and spread on surfaces of the plurality of connection terminals 12a and 12b.

The non-overlapping dimension L4 is a maximum dimension by which the surface-mount component 10A moves toward the center by the self-alignment effect when the solder non-wetting occurs.

As described above, with reference to claim 2 of the present invention, when the surface-mount component is mounted at the normal position on the circuit substrate and normal soldering is performed, the overlapping dimension between the electrode pad and the connection terminal is equal to or larger than the thickness dimension of the electrode pad, and the non-overlapping dimension that is the dimension of movement toward the center in the case of solder non-wetting is equal to or larger than the minimum indication line width of the standard position indication marks.

The sum of the overlapping dimension and the non-overlapping dimension equals to the width of the connection terminal. If the overlapping dimension is excessively large, the non-overlapping dimension becomes excessively small. When solder non-wetting occurs, the force toward the center caused by the self-alignment effect reduces to disable detection of the failure. Even if movement toward the center is caused due to the failure, the dimension of the movement is excessively small, which makes the determination by visual observation difficult.

On the other hand, if the overlapping dimension is excessively small, the strength of the integration of the surface-mount component and the circuit substrate is reduced. Taking into consideration the variation in dimensions when mounting the surface-mount component, it is appropriate that, in reality, the overlapping dimension and the non-overlapping dimension be substantially the same.

By setting the inter-electrode pitch and the inter-terminal pitch to be predetermined values corresponding to the dimension of the electrode pads, an appropriate overlapping dimension is secured, and still, self-alignment action sufficient for detection of solder non-wetting can be obtained.

The same applies to Embodiments 2 and 3 described below.

Non-solder regions of the plurality of electrode pads 22a and 22b and the copper foil patterns 26a and 26b connected to the plurality of electrode pads are covered with the solder resist films 24a and 24b as part of the entire area resist film 25 for an entire area of the front surface of the circuit substrate.

The entire area resist film 25 forming the solder resist films 24a and 24b is in a color that is different from a color of the base surface 21 of the circuit substrate 20A.

The standard position indication marks 23 are formed by leaving the entire area resist film 25 unapplied and exposing part of the base surface 21 in the shape of hooks, or printing, on the applied entire area resist film 25, white hooks of a color different from the color of the entire area resist film.

As described above, with reference to claim 3, 13 of the present invention, the solder resist material applied to the non-soldered regions of the electrode pads and the copper foil patterns for wiring is of a color different from that of the base of the circuit substrate. The standard position indication marks are formed by leaving the solder resist material unapplied in the shape of hooks or by printing white hooks on the applied solder resist material.

In the case of exposing the base surface, the standard position indication marks can be formed easily, and there is no risk that the thin standard position indication marks peel off.

In the case of silk printing in white, image recognition using an electronic camera is easy.

The same applies to Embodiments 2 and 3 described below.

The surface-mount component 10A includes, on the back surface thereof, the pair of connection terminals 12a and 12b formed in the shape of a rectangle and arranged in parallel with each other.

The circuit substrate 20A includes, on the front surface thereof, the pair of electrode pads 22a and 22b formed in the shape of a rectangle or a modified narrow rectangle with end portions thereof being rounded or chamfered, and arranged in parallel with each other.

The solder resist films 24a and 24b as part of the entire area resist film 25 are applied around the pair of electrode pads 24a and 22b.

The openings 30a and 30b in the metal mask 30 for squeezing and applying the solders 31a and 31b to the surface of the pair of electrode pads 22a and 22b are opposed to an entire area of exposed portions of the pair of electrode pads 22a and 22b without the solder resist films 24a and 24b applied thereto.

The thickness dimension of the metal mask 30 is larger than the thickness dimension of the solder resist films 24a and 24b. When the squeezed solders 31a and 31b are molten, the thickness dimension of the solder material is reduced to a predetermined value and the solder material spreads on entire surfaces of the pair of connection terminals 12a and 12b, the predetermined value being larger than the thickness dimension of the solder resist films 24a and 24b.

As described above, with reference to claim 4, 14 of the present invention, each of the connection terminals of the two-terminal surface-mount component is in the shape of a rectangle, and each of the electrode pads of the circuit substrate corresponding thereto is in the shape of a modified narrow rectangle. The solder resist film is formed between the pair of electrode pads. The openings in the metal mask are of the same dimension as that of the exposed surfaces of the electrode pads, and the molten solder is adapted to spread on the entire surfaces of the connection terminals.

Therefore, the molten solder goes around onto offset portions at which the electrode pads and the connection terminals do not mutually overlap, which can extend electrical connection surfaces between the electrode pads and the connection terminals, respectively.

The surface-mount component 10A is a heat-generating component, which principally includes one power diode, which is formed on a silicon substrate having a plane area of 1 $mm^2$ to 4 $mm^2$, and which includes the moisture-proof protective film as the cladding material 11.

The ratio L4/L3 between the overlapping dimension L3, which is a width of portions at which exposed portions of the plurality of electrode pads 22a and 22b without the solder resist films 24a and 24b applied thereto and the plurality of connection terminals 12a and 12b at the reference relative position mutually overlap, and the non-overlapping dimension L4 of the plurality of connection terminals 12a and 12b is from 1.1 to 0.9.

As described above, with reference to claims 8-12, 18-22 of the present invention, the surface-mount component is a small heat-generating component that is not encapsulated in resin, and the overlapping dimensions and the non-overlapping dimensions between the connection terminals and the electrode pads, respectively, are substantially the same.

Therefore, the electrode pads are formed using the back surface of the surface-mount component, and both the overlapping dimensions for securing the strength of the solder connection and the dimensions of movement toward the center in the case of solder non-wetting can be secured.

Further, heat generated by the surface-mount component is transferred from the connection terminals thereof to the electrode pads efficiently. The heat can be dissipated by transfer from the circuit substrate to the housing, and the heat can also be dissipated by radiation via the moisture-proof protective film into the housing.

Embodiment 2

(1) Detailed Description of Structure

The structure of an electronic circuit device according to Embodiment 2 of the present invention will be described below with reference to FIG. 8 as a back view of a surface-mount component according to Embodiment 2 of the present invention, FIG. 9 as a plan view of a circuit substrate according to Embodiment 2 of the present invention, and FIG. 10 as a sectional view of the circuit substrate taken along the line X-X of FIG. 9.

An electronic circuit device 100B according to Embodiment 2 is different from the electronic circuit device 100A according to Embodiment 1 mainly in that the electronic circuit device 100B is of a four-circular-terminal type and includes four connection terminals 12a to 12d and four electrode pads 22a to 22d, and like reference symbols are used to designate like or corresponding members throughout the figures.

Figure 8:
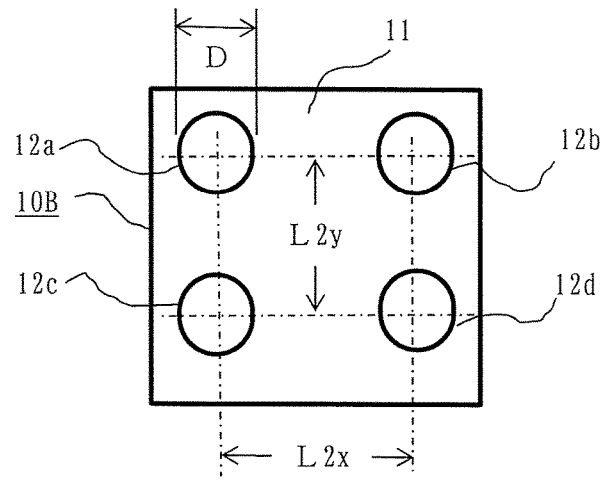
FIG. 8 is a back view of a surface-mount component according to Embodiment 2 of the present invention.

First, with reference to FIG. 8, the surface-mount component 10B is formed by, for example, arranging a power transistor and components relating to a gate circuit section of the transistor on a rectangular ceramic substrate (not shown) and applying the cladding material 11 as a moisture-proof coating material. Two pairs of circular connection terminals 12a and 12b, as well as 12c and 12d are exposed on the back surface of the surface-mount component 10B with inter-terminal pitches L2x and L2y between center lines thereof.

Reference symbol L2x is an inter-terminal pitch along a horizontal axis, and reference symbol L2y is an inter-terminal pitch along a vertical axis.

Figure 9:
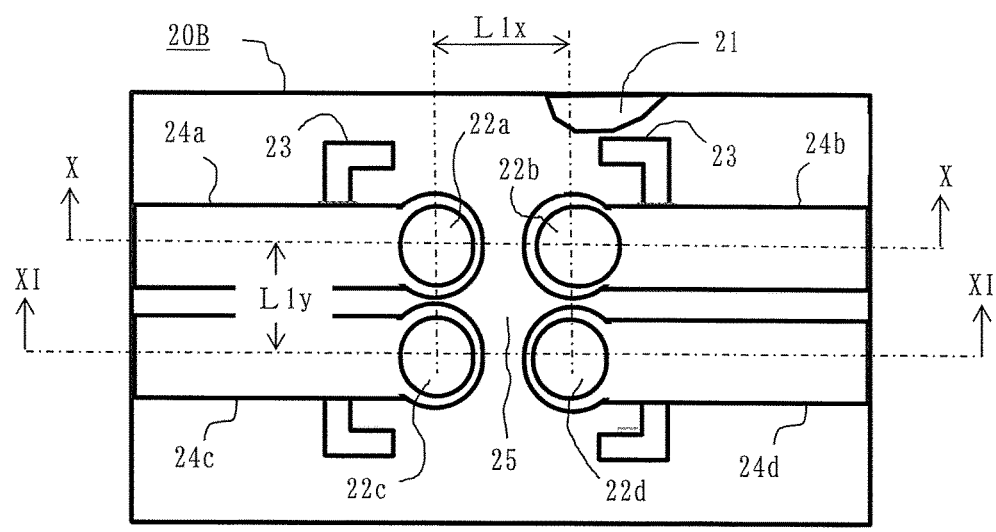
FIG. 9 is a plan view of a circuit substrate according to Embodiment 2 of the present invention.

Next, with reference to FIG. 9, two pairs of circular electrode pads 22a and 22b, and 22c and 22d are arranged on a front surface of a circuit substrate 20A housed in the housing (not shown) with inter-electrode pitches L1x and L1y between center lines thereof. The electrode pads 22a to 22d form ends of copper foil patterns 26a to 26d, respectively, that will be described below with reference to FIG. 10 (the copper foil patterns 26c and 26d are not shown), and other ends of the copper foil patterns 26a and 26b are adapted to be connected to other circuit components (not shown) that are mounted on the circuit substrate 20B.

Reference symbol L1x is an inter-electrode pitch along a horizontal axis, and reference symbol L1y is an inter-electrode pitch along a vertical axis.

The entire area resist film 25 is applied to substantially the entire surface of the base surface 21 of the circuit substrate 20B. Solder resist films 24a to 24d as part of the entire area resist film 25 are applied to portions around contours of the electrode pads 24a to 24d and surfaces of the copper foil patterns 26a to 26d, respectively, so that solder does not attach thereto.

The entire area resist film 25 and the solder resist films 24a to 24d are illustrated as separate elements for the sake of convenience of illustration in the drawings, but are, in reality, the same thing formed of the same material without distinction, and are applied to the front surface of the circuit substrate 20B in the same step.

Further, the standard position indication marks 23 formed on the front surface of the circuit substrate 20B indicate a reference mounting position of the surface-mount component 10B. The base surface is exposed in the shape of hooks at positions corresponding to four corners of the surface-mount component 10B, and can be visually observed as the standard position indication marks 23 against the entire area resist film 25 of a different color.

Besides, the standard position indication marks 23 may be, for example, formed by silk printing in white in the shape of hooks.

Figure 10:
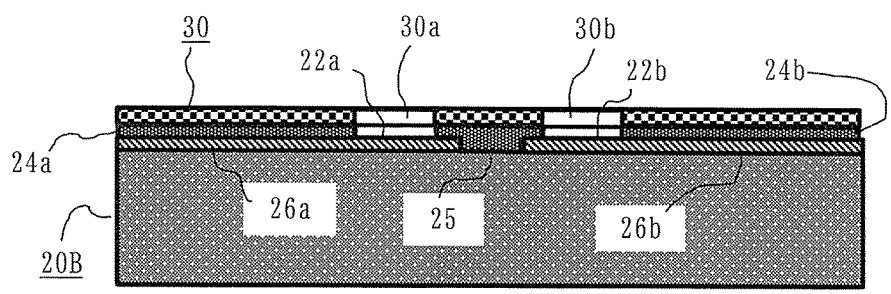
FIG. 10 is a sectional view of the circuit substrate taken along the line X-X of FIG. 9.

Next, with reference to FIG. 10 as a sectional view taken along the line X-X of FIG. 9, the two pairs of electrode pads 24a to 24d connecting to the copper foil patterns 26a to 26d, respectively, are formed by etching on the front surface of the circuit substrate 20B of, for example, a glass epoxy material.

Further, the solder resist films 24a to 24d cover the portions around the contours of the two pairs of electrode pads 22a to 22d and the surfaces of the copper foil patterns 26a to 26d, respectively, and contour center portions of the two pairs of electrode pads 22a to 22d are exposed surfaces.

The metal mask 30 is mounted on the front surface of the circuit substrate 20B having the solder resist films 24a to 24d applied thereto. The metal mask 30 has openings 30a to 30d (the openings 30c and 30d are not shown) formed therein at positions opposed to the contour center portions of the two pairs of electrode pads 22a to 22d, respectively.

When solder material paste is squeezed with a squeegee (spatula) from the outer surface side of the metal mask 30, the solder material is applied into the openings 30a to 30d. The volume of the applied solder material at this time corresponds to a product of a depth dimension, which is the sum of the thickness dimension of the metal mask 30 and the thickness dimension of the solder resist films 24a to 24d, and the areas of the openings 30a to 30d, that is, the areas of the exposed portions of the electrode pads 22a to 22d.

Figure 11:
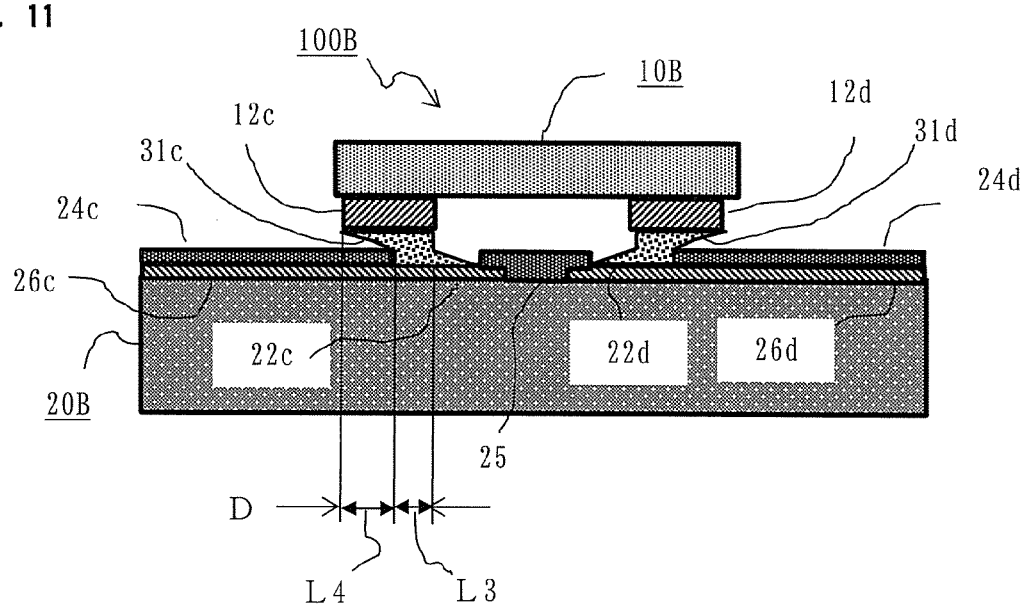
FIG. 11 is a sectional view of an electronic circuit device in a normal case according to Embodiment 2 of the present invention.
Figure 12:
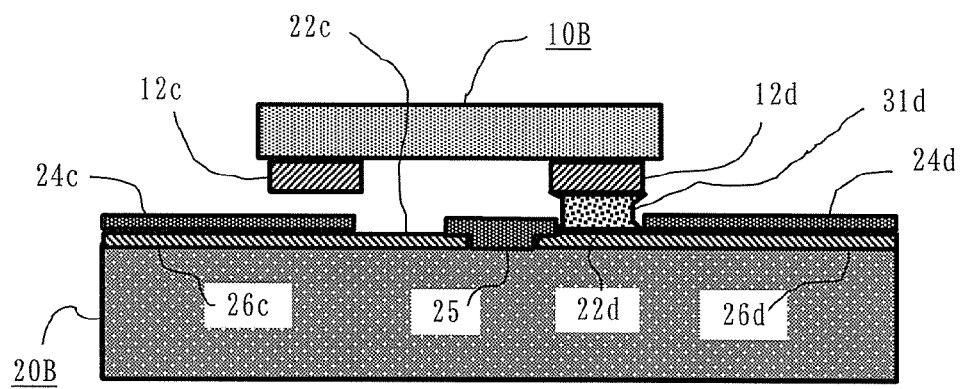
FIG. 12 is a sectional view similar to FIG. 11 of the electronic circuit device in a case of a soldering defect.

Next, description is made with reference to FIG. 11 as a sectional view of the electronic circuit device in a normal case according to Embodiment 2 of the present invention, and FIG. 12 as a sectional view similar to FIG. 11 of the electronic circuit device in a case of a soldering defect.

The sectional position of FIG. 11 corresponds to the sectional position taken along the line XI-XI of FIG. 9.

With reference to FIG. 11, the surface-mount component 10B is mounted on the circuit substrate 20B at an appropriate position. Through heating of solders 31a to 31d (the solders 31a and 31b are not shown) applied to the electrode pads 22a to 22d, respectively, in FIG. 10, the surface-mount component 10B and the circuit substrate 20B are integrated to form the electronic circuit device 100B.

The solders 31a to 31d are illustrated as being in a state of cooled and solidified after having been heated and molten. The solders applied over the entire exposed surfaces of the electrode pads 22a to 22d are spread on entire surfaces of the offset connection terminals 12a to 12d, respectively.

At this time, the sum W of the overlapping dimension L3, which is the width of portions at which the left and right electrode pads 22a and 22b, and 22c and 22d and the left and right connection terminals 12a and 12b, and 12c and 12d mutually overlap, and the non-overlapping dimension L4, which is the width of the non-overlapping portions, that is, L3+L4, is equal to a diameter D of the connection terminals 12a to 12d.

Further, the inter-terminal pitch L2x and the inter-electrode pitch L1x illustrated in FIG. 8 and FIG. 9 have the relationship of L2x=L1x+2×L3.

Therefore, the relationship of L3=(L2x−L1x)/2 holds, where L3 is the overlapping dimension. As design values, the overlapping dimension L3 and the non-overlapping dimension L4 are equal to each other. All of the diameter D=L3+L4 of the connection terminals 12a to 12d and the diameter D of the electrode pads 22a to 22d are of the same value.

FIG. 12 is a sectional view of the electronic circuit device 100B in a case in which heat processing is performed under a state in which the solder material is applied to the right electrode pads 22b and 22d, but is not applied to the left electrode pads 22a and 22c. In this case, by a self-alignment action due to surface tension acting on the molten solder, a center position of each of the right electrode pads 22b and 22d and a center position of each of the connection terminals 12b and 12d are spatially coincident with each other As a result, a connected position of the surface-mount component 10B after the soldering is moved to the left with respect to the position defined by the standard position indication marks 23, with an offset dimension δ of D/2, where D is the diameter of the electrode pad 22d.

(2) Detailed Description of Action

Next, local action of soldering of the electronic circuit device 100B structured as illustrated in FIG. 11 will be described in detail with reference to FIG. 13A, FIG. 13B, FIG. 14A, and FIG. 14B.

Figure 13A:
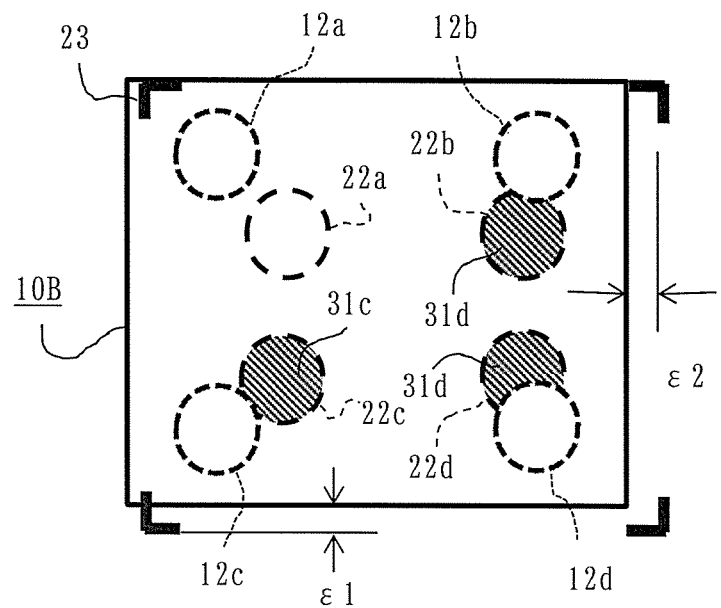
FIG. 13A is a plan view in phantom in a first aspect before soldering of the electronic circuit device in FIG. 12, where one point of four points is in solder non-wetting state.
Figure 13B:
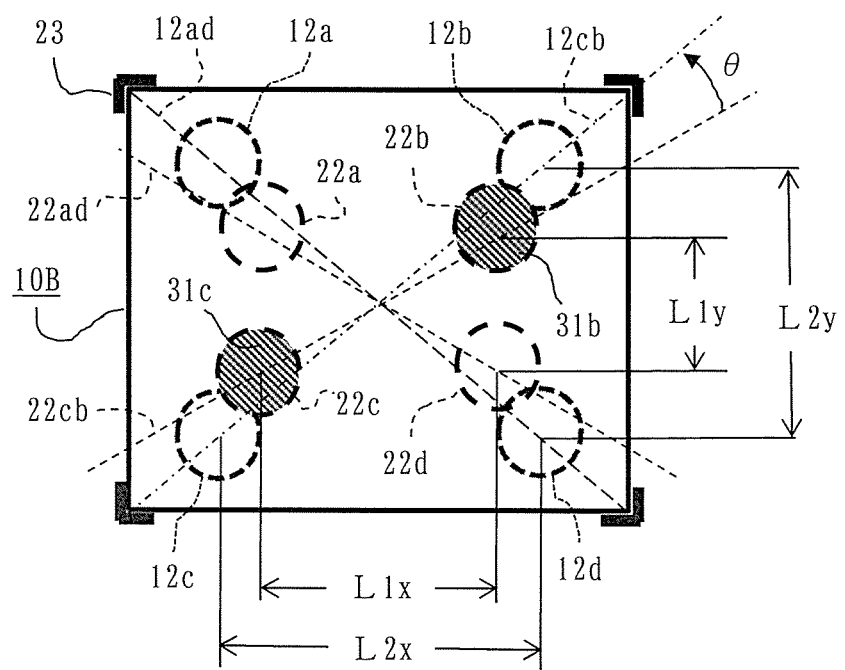
FIG. 13B is a plan view in phantom in a first aspect after soldering of the electronic circuit device in FIG. 12, where diagonal two points are in solder non-wetting state.
Figure 14A:
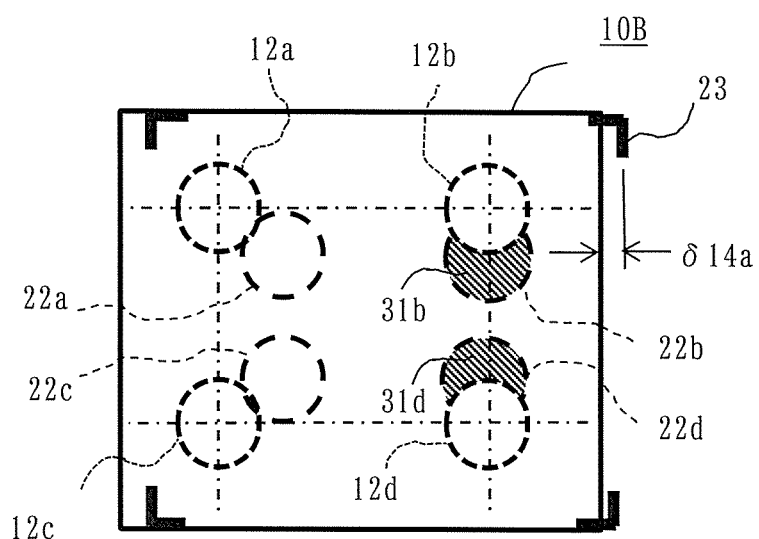
FIG. 14A is a plan view in phantom in a second aspect before soldering of the electronic circuit device in FIG. 12, where vertical two points are in solder non-wetting state.
Figure 14B:
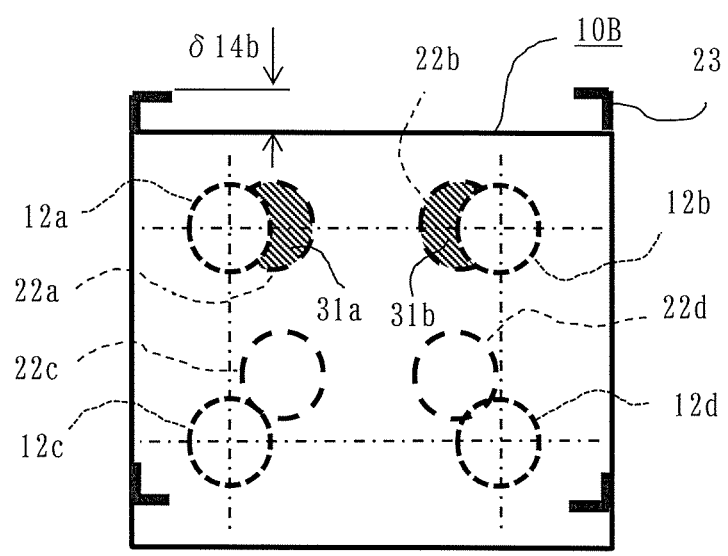
FIG. 14B is a plan view in phantom in a second aspect after soldering of the electronic circuit device in FIG. 12, where horizontal two points are in solder non-wetting state.

FIG. 13A is a plan view in phantom in a first aspect before soldering of the electronic circuit device in FIG. 12, where one point of four points is in solder non-wetting state; FIG. 13B is a plan view in phantom in a first aspect after soldering of the electronic circuit device in FIG. 12, where diagonal two points are in solder non-wetting state; FIG. 14A is a plan view in phantom in a second aspect before soldering of the electronic circuit device in FIG. 12, where vertical two points are in solder non-wetting state; and FIG. 14B is a plan view in phantom in a second aspect after soldering of the electronic circuit device in FIG. 12, where horizontal two points are in solder non-wetting state.

First, as a process of fabricating the electronic circuit device 100B, as illustrated in FIG. 10, the metal mask 30 is mounted on the circuit substrate 20B illustrated in FIG. 9, and the solder material paste is squeezed and applied through the openings 30a to 30d. Then, under a state in which the metal mask 30 is removed, the surface-mount component 10B illustrated in FIG. 8 and other circuit components (not shown) are mounted on the circuit substrate 20B. After that, the entire circuit substrate 20B with the components mounted thereon is preheated, heated, and cooled to make solder connection.

FIG. 13A is an illustration of a state after solder connection is made with the surface-mount component 10B being mounted at the standard position under a state in which solder non-wetting of the upper left electrode pad 22a occurs and the solder material is correctly applied to other electrode pads 22b to 22d.

In this case, the lower right connection terminal 12d at the diagonal position is attracted to the electrode pad 22d side. Thus, the surface-mount component 10B is attracted toward the upper left corner and is offset from the standard position indication marks 23 by offset dimensions ε1 and ε2.

For the following reason, the ratio L2x/L2y between the inter-terminal pitches L2x and L2y and the ratio L1x/L1y between the inter-electrode pitches L1x and L1y in FIG. 13A, FIG. 13B, FIG. 14A, and FIG. 14B are different.

FIG. 13B is an illustration of a state before solder connection is made with the surface-mount component 10B being mounted at the standard position under a state in which solder non-wetting state of the upper left electrode pad 22a and the lower right electrode pad 22d on a rightwardly descending diagonal line 22ad occurs and the solder material is correctly applied to the lower left electrode pad 22c and the upper right electrode pad 22b on a rightwardly ascending diagonal line 22cb.

In this case, when the ratio L2x/L2y between the inter-terminal pitch L2x along the horizontal axis and the inter-terminal pitch L2y along the vertical axis in FIG. 8 is set to be different from the ratio L1x/L1y between the inter-electrode pitch L1x along the horizontal axis and the inter-electrode pitch L1y along the vertical axis in FIG. 9, in a normal state, the lower left connection terminal 12c and the electrode pad 22c, and the upper right connection terminal 12b and the electrode pad 22b, which are located on the rightwardly ascending diagonal lines 12cb and 22cb, are not arranged on one straight line. If solder non-wetting of the electrode pads 22a and 22d on the rightwardly descending diagonal line 22ad occurs, the surface-mount component 10B rotates and moves so that the lower left connection terminal 12c and the electrode pad 22c, and the upper right connection terminal 12b and the electrode pad 22b, which are located on the rightwardly ascending diagonal lines 12cb and 22cb, are arranged on one straight line to be settled at a position at which the straight line forms an offset tilt angle θ with a line connecting the standard position indication marks 23 at the lower left corner and the upper right corner.

FIG. 14A is an illustration of a state after solder connection is made with the surface-mount component 10B being mounted at an appropriate position on the circuit substrate 20B under a state in which solder is not applied to the two left electrode pads 22a and 22c, but is applied only to the two right electrode pads 22b and 22d.

In this case, the right connection terminals 12b and 12d are attracted to the electrode pads 12b and 12d, and thus, the surface-mount component 10B is attracted to the left and is offset from the standard position indication marks 23 by an offset dimension δ14a.

FIG. 14B is an illustration of a state after solder connection is made with the surface-mount component 10B being mounted at an appropriate position on the circuit substrate 20B under a state in which solder is not applied to the two lower electrode pads 22c and 22d, but is applied only to the two upper electrode pads 22a and 22b.

In this case, the upper connection terminals 12a and 12b are attracted to the electrode pads 22a and 22b, and thus, the surface-mount component 10B is attracted downward and is offset from the standard position indication marks 23 by an offset dimension δ14b.

With regard to the offset dimensions ε1 and ε2, the offset tilt angle θ, and the offset dimensions δ14a and δ14b illustrated in FIG. 13A, FIG. 13B, FIG. 14A, and FIG. 14B, whether or not there is abnormality is determined by visual observation or by display analysis of an image taken by an electronic camera (not shown). This enables monitoring of the state of solder connection on the back surface side of the surface-mount component 10B that cannot be visually observed.

In the above description, the connection terminals 12a to 12d and the electrode pads 22a to 22d are in the shape of a circle, but the shape may be a polygon such as a hexagon or an octagon.

(3) Gist and Features of Embodiment 2

As apparent from the above description, the electronic circuit device according to Embodiment 2 of the present invention is the electronic circuit device 100B, including:

the plurality of electrode pads 22a to 22d formed on the front surface of the circuit substrate 20B; and the plurality of connection terminals 12a to 12d formed as many as the plurality of electrode pads 22a to 22d on the back surface of the surface-mount component 10B, the plurality of electrode pads 22a to 22d and the plurality of connection terminals 12a to 12d being connected with heated solders 31a to 31d, respectively, in which the solders 31a to 31d are lead-free solder having a lead content of 0.1% or less in mass ratio, in which the plurality of connection terminals 12a to 12d are not formed on the end surface of the side portion and on the front surface of the surface-mount component 10B and are formed on the back surface of the surface-mount component 10B to be opposed to the front surface of the circuit substrate 20B, in which the front surface of the circuit substrate 20B serving as a component mount surface has the standard position indication marks 23 formed thereon at least at diagonal positions of the surface-mount component 10B, in which the standard position indication marks 23 indicate a contour position of the surface-mount component 10B as a reference relative position where the plurality of connection terminals 12a to 12d are mounted at central positions of the plurality of electrode pads 22a to 22d, respectively, and in which in order that when a part of the solders 31a to 31d applied to the plurality of electrode pads 22a to 22d is lacked and solder non-wetting state of one of a pair of electrode pads among the plurality of electrode pads 22a to 22d occurs, an actual contour position of the surface-mount component 10B becomes different from the contour position indicated by the standard position indication marks 23, one of the horizontal inter-electrode pitch L1x and the vertical inter-electrode pitch L1y of the plurality of electrode pads 22a to 22d is smaller than corresponding one of the horizontal inter-terminal pitch L2x and the vertical inter-terminal pitch L2y of the plurality of connection terminals 12a to 12d.

When the surface-mount component 10B is mounted at the reference relative position, the overlapping dimension L3 that is a width of portions at which the plurality of electrode pads 22a to 22d and the plurality of connection terminals 12a to 12d mutually overlap, is equal to or larger than at least the thickness dimension of the plurality of electrode pads 22a to 22d. The non-overlapping dimension L4 that is a width of portions at which the plurality of electrode pads 22a to 22d and the plurality of offset connection terminals 12a to 12d do not mutually overlap, is larger than a minimum indication line width of the standard position indication marks 23 capable of being visually recognized.

The overlapping dimension L3 is a requirement for the solders 31a to 31d applied to the plurality of electrode pads 22a to 22d to be connected to the plurality of connection terminals 12a to 12d and to be molten and spread on surfaces of the plurality of connection terminals 12a to 12d.

The non-overlapping dimension L4 is a maximum dimension by which the surface-mount component 10B moves toward the center by the self-alignment effect when the solder non-wetting occurs.

Non-solder regions of the plurality of electrode pads 22a to 22d and the copper foil patterns 26a to 26d connected to the plurality of electrode pads are covered with solder resist films 24a to 24d as part of the entire area resist film 25 for an entire area of the front surface of the circuit substrate.

The entire area resist film 25 forming the solder resist films 24a to 24d is in a color that is different from a color of the base surface 21 of the circuit substrate 20B.

The standard position indication marks 23 are formed by leaving the entire area resist film 25 unapplied and exposing part of the base surface 21 in the shape of hooks, or printing, on the applied entire area resist film 25, white hooks of a color different from the color of the entire area resist film.

The surface-mount component 10B includes, on the back surface thereof, the two pairs of connection terminals 12a to 12d formed in the shape of a circle or a polygon, and arranged at vertices of a rectangle.

The circuit substrate 20B includes, on the front surface thereof, the two pairs of electrode pads 22a to 22d formed in the shape of a circle or a polygon, and arranged at vertices of a rectangle.

The solder resist films 24a to 24d as a part of the entire area resist film 25 are applied around the two pairs of electrode pads 22a to 22d.

The openings 30a to 30d in the metal mask 30 for squeezing and applying the solders 31a to 31d to the surfaces of the two pairs of electrode pads 22a to 22d are opposed to an entire area of exposed portions of the two pairs of electrode pads 22a to 22d without the solder resist films 24a to 24d being applied thereto.

The thickness dimension of the metal mask 30 is larger than the thickness dimension of the solder resist films 24a to 24d. When the squeezed solders 31a to 31d are molten, the thickness dimension of the solder material is reduced to a predetermined value and the solder material spreads on entire surfaces of the two pairs of connection terminals 12a to 12d, the predetermined value being larger than the thickness dimension of the solder resist films 24a to 24d.

As described above, with reference to claim 5, 15 of the present invention, each of the connection terminals of the four-terminal surface-mount component and each of the electrode pads of the circuit substrate corresponding thereto has a shape of circle. The solder resist films are formed between the two pairs of electrode pads. While the openings in the metal mask are of the same dimension as that of the exposed surfaces of the electrode pads, the molten solder is adapted to spread on the entire surfaces of the connection terminals.

Therefore, the molten solder goes around onto offset or displaced portions at which the electrode pads and the connection terminals do not mutually overlap, which can extend electrical connection surfaces between the electrode pads and the connection terminals, respectively.

In the two pairs of electrode pads 22a to 22d, the inter-electrode pitch L1x between a pair of electrode pads 22a and 22b arranged along the horizontal axis and the inter-electrode pitch L1x between remaining another pair of electrode pads 22c and 22d are the same, and the inter-electrode pitch L1y between a pair of electrode pads 22a and 22c arranged along the vertical axis and the inter-electrode pitch L1y between remaining another pair of electrode pads 22b and 22d are the same.

In the two pairs of connection terminals 12a to 12d, the inter-terminal pitch L2x between a pair of connection terminals 12a and 12b arranged along the horizontal axis and the inter-terminal pitch L2x between remaining another pair of connection terminals 12c and 12d are the same, and the inter-terminal pitch L2y between a pair of connection terminals 12a and 12c arranged along the vertical axis and the inter-terminal pitch L2y between remaining another pair of connection terminals 12b and 12d are the same.

The horizontal inter-electrode pitch L1x and the vertical inter-electrode pitch L1y in a pair are smaller than the horizontal inter-terminal pitch L2x and the vertical inter-terminal pitch L2y in a pair, respectively. A ratio L1x/L1y between the horizontal inter-electrode pitch L1x and the vertical inter-electrode pitch L1y and a ratio L2x/L2y between the horizontal inter-terminal pitch L2x and the vertical inter-terminal pitch L2y are set to have different values, so that when a part of the solders 31a to 31d applied to the plurality of electrode pads 22a to 22d is lacked and solder non-wetting state of an electrode pad occurs, an actual contour position of the surface-mount component 10B becomes different from the contour position indicated by the standard position indication marks 23.

As described above, with reference to claim 6, 16 of the present invention, by setting the horizontal inter-electrode pitch L1x and the vertical inter-electrode pitch L1y in a pair with regard to the four-terminal surface-mount component to be smaller than the horizontal inter-terminal pitch L2x and the vertical inter-terminal pitch L2y in a pair, respectively, when solder non-wetting of one, two along the horizontal axis, or two along the vertical axis of the four electrode pads occurs, the solder non-wetting state is detected by the contour position of the surface-mount component after the solder connection that is different from the position of the standard position indication marks. Further, by setting the aspect ratio of the inter-electrode pitches and the aspect ratio of the inter-terminal pitches so as to be different from each other, when a solder non-wetting state of a pair of electrode pads along a diagonal line occurs, the diagonal line passing through the electrode pads and the diagonal line passing through the connection terminals to which solder is attached are spatially coincident with each other, and the tilt angle is formed by the connected position of the surface-mount component. This state can be detected by comparison with the relative position with respect to the standard position indication marks.

Therefore, the scheme of arranging the electrode pads and the connection terminals enables the detection of various kinds of solder non-wetting.

The surface-mount component 10B is a heat-generating component, which principally includes two power transistors, which is formed on a silicon substrate having a plane area of 1 mm$^2$ to 4 mm$^2$, and which includes a moisture-proof protective film as the cladding material 11.

The ratio L4/L3 between the overlapping dimension L3, which is a width of portions at which exposed portions of the plurality of electrode pads 22a to 22d without the solder resist films 24a to 24d applied thereto and the plurality of connection terminals 12a to 12d at the reference relative position mutually overlap, and the non-overlapping dimension L4 of the plurality of connection terminals 12a to 12d is from 1.1 to 0.9.

As described above, with reference to claims 8-12, 18-22 of the present invention, the surface-mount component is a small heat-generating component that is not encapsulated in resin, and the overlapping dimensions and the non-overlapping dimensions between the connection terminals and the electrode pads, respectively, are substantially the same.

Therefore, the electrode pads are formed using the back surface of the surface-mount component, and both the overlapping dimensions for securing the strength of the solder connection and the dimensions of movement toward the center in the case of solder non-wetting can be secured.

Further, heat generated by the surface-mount component is transferred from the connection terminals thereof to the electrode pads efficiently. The heat can be dissipated by transfer from the circuit substrate to the housing, and the heat can also be dissipated by radiation via the moisture-proof protective film into the housing.

Embodiment 3

(1) Detailed Description of Structure and Action

A structure of an electronic circuit device according to Embodiment 3 of the present invention will be described below with reference to FIG. 15 as a back view of a surface-mount component according to Embodiment 3 of the present invention, FIG. 16 as a plan view of a circuit substrate according to Embodiment 3 of the present invention, and FIG. 17 as a sectional view of the circuit substrate taken along the line XVII-XVII of FIG. 16.

An electronic circuit device 100C according to Embodiment 3 is different from the electronic circuit device 100A according to Embodiment 1 mainly in that the electronic circuit device 100C is of a mixed-three-terminal type and includes two circular connection terminals 12a and 12c and one oval connection terminal 12e, and two circular electrode pads 22a and 22c and one oval electrode pad 22e correspondingly thereto, respectively, where like reference symbols are used to designate like or corresponding members throughout the figures.

Figure 15:
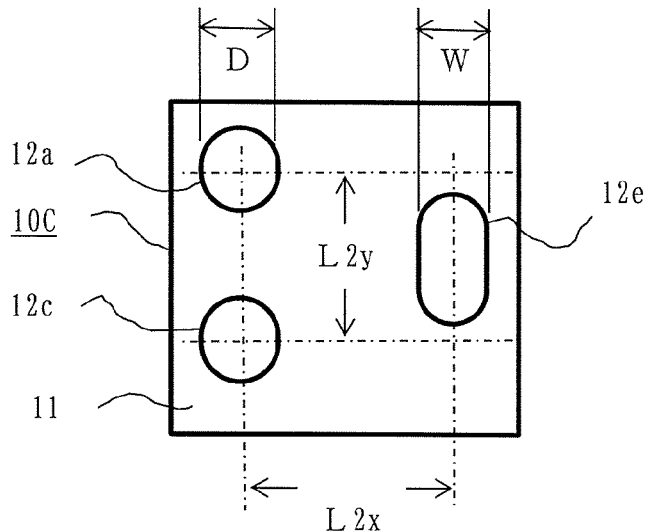
FIG. 15 is a back view of a surface-mount component according to Embodiment 3 of the present invention.

First, with reference to FIG. 15, a surface-mount component 10C is formed by, for example, arranging a power transistor on a rectangular ceramic substrate (not shown) and applying the cladding material 11 as a moisture-proof coating material. The circular connection terminals 12a and 12c and the oval connection terminal 12e are exposed on the back surface of the surface-mount component 10C with inter-terminal pitches L2x and L2y between center lines thereof.

Reference symbol L2x is an inter-terminal pitch along a horizontal axis, and reference symbol L2y is an inter-terminal pitch along a vertical axis.

Figure 16:
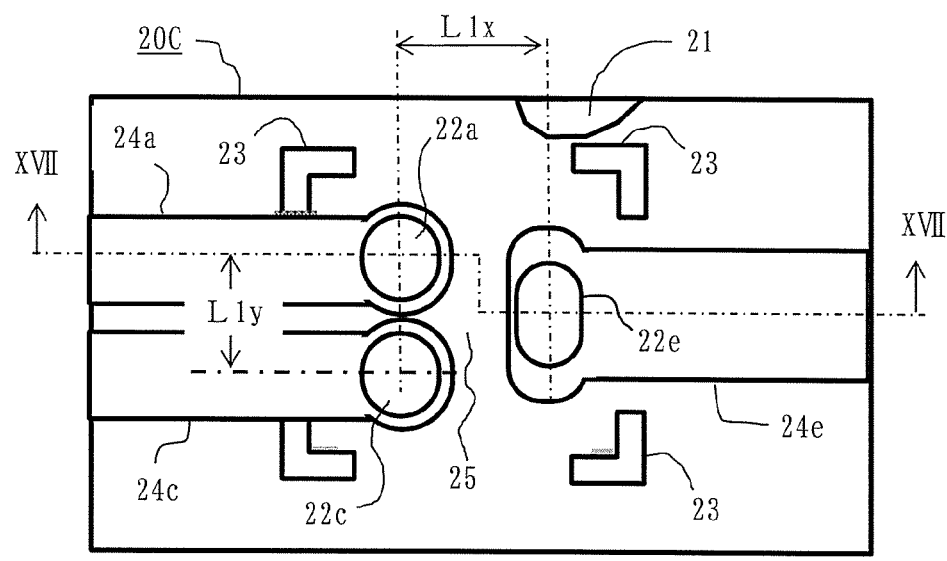
FIG. 16 is a plan view of a circuit substrate according to Embodiment 3 of the present invention.

Next, with reference to FIG. 16, the circular electrode pads 22a and 22c and the oval electrode pad 22e are arranged on a front surface of a circuit substrate 20C housed in the housing (not shown) with inter-electrode pitches L1x and L1y between center lines thereof. The electrode pads 22a, 22c, and 22e form ends of copper foil patterns 26a, 26c, and 26e, respectively, that will be described below with reference to FIG. 17 (the copper foil pattern 26c is not shown). The other ends of the copper foil patterns 26a, 26c, and 26e are adapted to be connected to other circuit components (not shown) that are mounted on the circuit substrate 20C.

Reference symbol L1x is an inter-electrode pitch along a horizontal axis, and reference symbol L1y is an inter-electrode pitch along a vertical axis.

The entire area resist film 25 is applied to substantially the entire surface of the base surface 21 of the circuit substrate 20C. Solder resist films 24a, 24c, and 24e as a part of the entire area resist film 25 are applied to portions around contours of the electrode pads 22a, 22c, and 22e and surfaces of the copper foil patterns 26a, 26c, and 26e, respectively, so that solder does not attach thereto.

The entire area resist film 25 and the solder resist films 24a, 24c, and 24e are illustrated as separate elements for the sake of convenience of illustration in the drawings, but are, in reality, the same thing formed of the same material without distinction, and are applied to the front surface of the circuit substrate 20C in the same step.

Further, the standard position indication marks 23 formed on the front surface of the circuit substrate 20C indicate a reference mounting position of the surface-mount component 10C. The base surface is exposed in the shape of hooks at positions corresponding to four corners of the surface-mount component 10C, and can be visually observed as the standard position indication marks 23 against the entire area resist film 25 of a different color.

Besides, the standard position indication marks 23 may be, for example, formed by silk printing in white in the shape of hooks.

Figure 17:
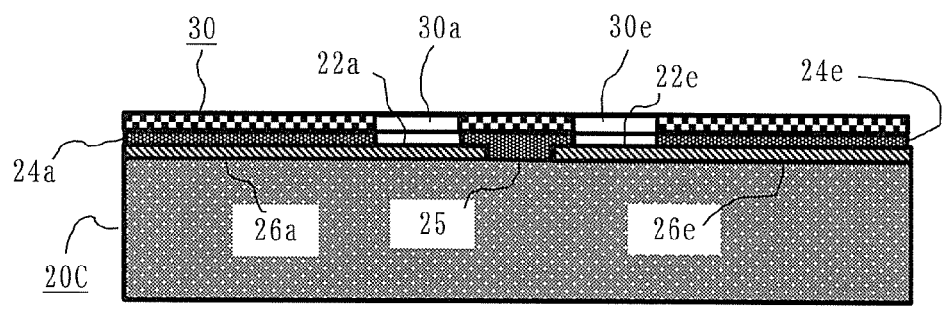
FIG. 17 is a sectional view of the circuit substrate taken along the line XVII-XVII of FIG. 16.

Next, with reference to FIG. 17 as a sectional view taken along the line XVII-XVII of FIG. 16, the electrode pads 22a, 22c, and 22e connecting to the copper foil patterns 26a, 26c, and 26e, respectively, are formed by etching on the front surface of the circuit substrate 20C of, for example, a glass epoxy material.

Further, the solder resist films 24a, 24c, and 24e cover the portions around the contours of the electrode pads 22a, 22c, and 22e and the surfaces of the copper foil patterns 26a, 26c, and 26e, respectively, and contour center portions of the electrode pads 22a, 22c, and 22e are exposed surfaces.

The metal mask 30 is mounted on the front surface of the circuit substrate 20C having the solder resist films 24a, 24c, and 24e applied thereto. The metal mask 30 has openings 30a, 30c, and 30e (the opening 30c is not shown) formed therein at positions opposed to the contour center portions of the electrode pads 22a, 22c, and 22e, respectively.

When solder material paste is squeezed with a squeegee (spatula) from the outer surface side of the metal mask 30, the solder material is applied into the openings 30a, 30c, and 30e. The volume of the applied solder material at this time corresponds to a product of a depth dimension, which is the sum of the thickness dimension of the metal mask 30 and the thickness dimension of the solder resist films 24c, 24c, and 24e and the areas of the openings 30a, 30c, and 30e, that is, the areas of the exposed portions of the electrode pads 22a, 22c, and 22e.

Next, descriptions of the structure and action will be made with reference to FIG. 18 as a sectional view of the electronic circuit device in a normal case according to Embodiment 3 of the present invention, and FIG. 19 as a sectional view similar to FIG. 18 of the electronic circuit device in a case of a soldering defect.

Figure 18:
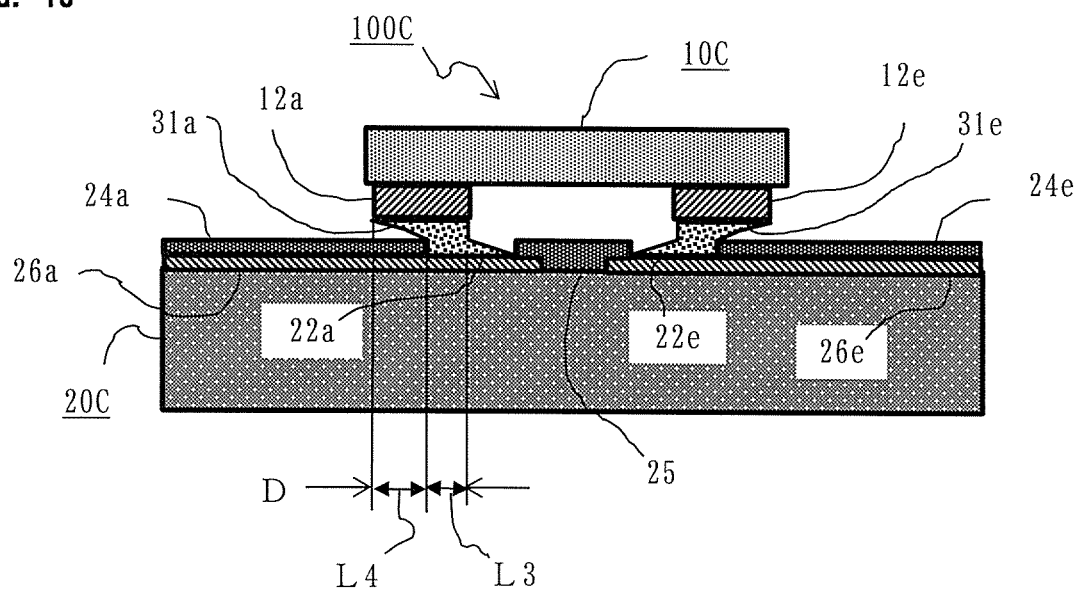
FIG. 18 is a sectional view of an electronic circuit device in a normal case according to Embodiment 3 of the present invention.

With reference to FIG. 18, the surface-mount component 10C is mounted on the circuit substrate 20C at an appropriate position. Through heating of solders 31a, 31c, and 31e (the solder 31c is not shown) applied to the electrode pads 22a, 22c, and 22e, respectively, in FIG. 17, the surface-mount component 10C and the circuit substrate 20C are integrated to form the electronic circuit device 100C.

The solders 31a, 31c, and 31e are illustrated as being in a state of cooled and solidified after being heated and molten. The solders applied to the entire exposed surfaces of the electrode pads 22a, 22c, and 22e are spread on entire surfaces of the offset connection terminals 12a, 12c, and 12e, respectively.

At this time, a sum of the overlapping dimension L3, which is the width of portions at which the electrode pads 22a, 22c, and 22e and the connection terminals 12a, 12c, and 12e mutually overlap, and the non-overlapping dimension L4, which is the width of the non-overlapping portions, that is, L3+L4, is equal to a diameter D or a width W of the connection terminals 12a, 12c, and 12e.

Further, the inter-terminal pitch L2x and the inter-electrode pitch L1x illustrated in FIG. 15 and FIG. 16 have the relationship of L2x=L1x+2×L3.

Therefore, the relationship of L3=(L2x−L1x)/2 holds, where L3 is the overlapping dimension. As design values, the overlapping dimension L3 and the non-overlapping dimension L4 are equal to each other, and the diameter D=L3+L4 of the connection terminals 12a and 12c or the width W=L3+L4 of the connection terminal 12e, and the diameter D or the width W of the electrode pads 22a, 22c, and 22e are of the same value.

Figure 19:
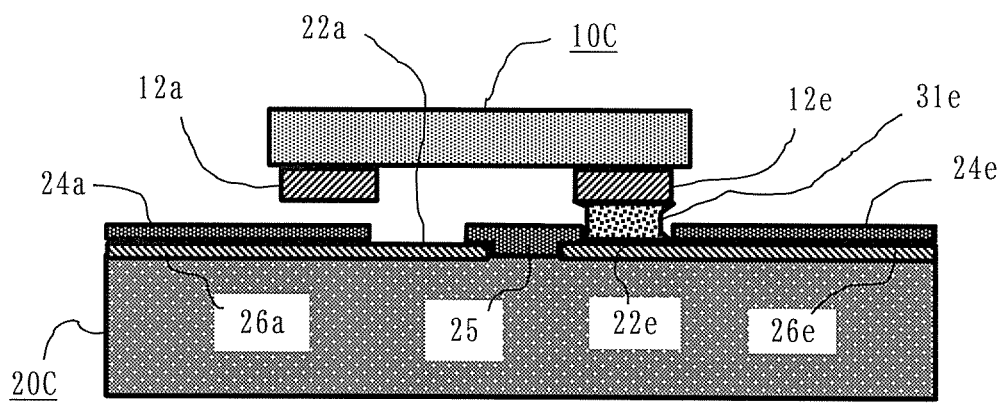
FIG. 19 is a sectional view similar to FIG. 18 of the electronic circuit device in a case of a soldering defect.

FIG. 19 is a sectional view of the electronic circuit device 100C in a case in which heat processing is performed under a state in which the solder material is applied to the right electrode pad 22e, but is not applied to the left electrode pads 22a and 22c. In this case, by a self-alignment action due to surface tension acting on the molten solder, a center position of the right electrode pad 22e and a center position of the connection terminal 12e are spatially coincident with each other, and, as a result, a connected position of the surface-mount component 10C after the soldering is moved to the left with respect to the position defined by the standard position indication marks 23, with an offset dimension δ of W/2, where W is the electrode width of the electrode pad 22e.

If solder non-wetting state of the right electrode pad 22e occurs and solder is applied to the left electrode pads 22a and 22c, after the solder connection, the connection terminals 12a and 12c are attracted to the electrode pads 22a and 22c, respectively, the surface-mount component 10C moves to the right, and the offset dimension δ thereof is D/2, where D is the electrode diameter of the electrode pads 22a and 22c.

If solder non-wetting state of any one of the left electrode pads 22a and 22c occurs, after the solder connection, one of the connection terminal 12a and the connection terminal 12c is attracted to the corresponding one of the electrode pad 22a and the electrode pad 22c, the surface-mount component 10C is rotated, and the offset tilt angle is formed.

With regard to the offset dimension and the offset tilt angle, whether or not there is abnormality is determined by visual observation or by display analysis of an image taken by an electronic camera (not shown). This enables monitoring of the state of solder connection on the back surface side of the surface-mount component 10C that cannot be visually observed.

Meanwhile, in the case of lead-free solder, there is a problem in that the melting temperature of the solder becomes higher and the electrode pads are more liable to peel off, and overcoating outer peripheral portions of the electrode pads with a solder resist film is an effective measure thereagainst.

However, overcoating the outer peripheral portions of the electrode pads having a very small area reduces an effective area of solder connection surfaces.

To minimize this area reduction rate, a circular electrode pad that has a shorter circumference for the same area is advantageous over a rectangular electrode pad.

Specifically, when, for example, a circular electrode having a diameter D1 is used for the purpose of obtaining an electrode area S, a circumference L1 thereof is calculated by the following Expression 1:

$$\pi \times D1 \times D1/4 = S, \therefore D1 = 2\sqrt{(S/\pi)}, L1 = \pi \times D1 = 2 \times \sqrt{(S \times \pi)} \quad \text{(Expression 1)}$$

When a square electrode having a side length D2 is used for the purpose of obtaining the same electrode area S, a circumference L2 thereof is calculated by the following Expression 2:

$$D2 \times D2 = S, \therefore D2 = \sqrt{(S)}, L2 = 4 \times D2 = 4 \times \sqrt{(S)} \quad \text{(Expression 2)}$$

A ratio L1/L2 of the circumferences is $\sqrt{(\pi)}/2=0.886$, which indicates that the circular electrode is advantageous.

In the above description, the connection terminals 12a and 12c and the electrode pads 22a and 22c are in the shape of a circle, but the shape may be a polygon such as a hexagon or an octagon.

The same applies to the electrode pads 22a to 22d in Embodiment 2.

(2) Gist and Features of Embodiment 3

As apparent from the above description, the electronic circuit device according to Embodiment 3 of the present invention is the electronic circuit device 100C, including:

the plurality of electrode pads 22a, 22c, and 22e formed on the front surface of the circuit substrate 20C; and the plurality of connection terminals 12a, 12c, and 12e formed as many as the plurality of electrode pads 22a, 22c, and 22e on the back surface of the surface-mount component 10A, 10B, or 10C, the plurality of electrode pads 22a, 22c, and 22e and the plurality of connection terminals 12a, 12c, and 12e being connected with heated solders 31a, 31c, and 31e, respectively, in which the solders 31a, 31c, and 31e are lead-free solder having a lead content of 0.1% or less in mass ratio, in which the plurality of connection terminals 12a, 12c, and 12e are not formed on the end surface of the side portion and on the front surface of the surface-mount component 100 and are formed only on the back surface of the surface-mount component 100 to be opposed to the front surface of the circuit substrate 20C, in which a component mount surface which is the front surface of the circuit substrate 20C has the standard position indication marks 23 formed thereon at least at diagonal positions of the surface-mount component 10C, in which the standard position indication marks 23 indicate a contour position of the surface-mount component 100 as a reference relative position where the plurality of connection terminals 12a, 12c, and 12e are mounted at central positions of the plurality of electrode pads 22a, 22c, and 22e, respectively, and in which in order that when a part of the solders 31a, 31c, and 31e applied to the plurality of electrode pads 22a, 22c, and 22e is lacked and solder non-wetting state of one of a pair of electrode pads among the plurality of electrode pads 22a, 22c, and 22e occurs, an actual contour position of the surface-mount component 100 becomes different from the contour position indicated by the standard position indication marks 23, one of the horizontal inter-electrode pitch L1x and the vertical inter-electrode pitch L1y of the plurality of electrode pads 22a, 22c, and 22e is smaller than corresponding one of the horizontal inter-terminal pitch L2x and the vertical inter-terminal pitch L2y of the plurality of connection terminals 12a, 12c, and 12e.

When the surface-mount component 100 is mounted at the reference relative position, the overlapping dimension L3 that is a width of portions at which the plurality of electrode pads 22a, 22c, and 22e and the plurality of connection terminals 12a, 12c, and 12e mutually overlap, is equal to or larger than at least the thickness dimension of the plurality of electrode pads 22a, 22c, and 22e. The non-overlapping dimension L4 that is a width of portions at which the plurality of electrode pads 22a, 22c, and 22e and the plurality of offset connection terminals 12a, 12c, and 12e do not mutually overlap, is larger than a minimum indication line width of the standard position indication marks 23 capable of being visually recognized.

The overlapping dimension L3 is a requirement for the solders 31a, 31c, and 31e applied to the plurality of electrode pads 22a, 22c, and 22e to be connected to the plurality of connection terminals 12a, 12c, and 12e and to be molten and spread on surfaces of the plurality of connection terminals 12a, 12c, and 12e.

The non-overlapping dimension L4 is a maximum dimension by which the surface-mount component 10C moves toward the center by the self-alignment effect when the solder non-wetting state occurs.

Non-solder regions of the plurality of electrode pads 22a, 22c, and 22e and the copper foil patterns 26a, 26c, and 26e connected to the plurality of electrode pads are covered with the solder resist films 24a, 24c, and 24e as a part of the entire area resist film 25 over an entire area of the front surface of the circuit substrate.

The entire area resist film 25 forming the solder resist films 24a, 24c, and 24e is in a color that is different from a color of the base surface 21 of the circuit substrate 20C.

The standard position indication marks 23 are formed by leaving the entire area resist film 25 unapplied and exposing a part of the base surface 21 in the shape of hooks, or printing, on the applied entire area resist film 25, white hooks of a color different from the color of the entire area resist film.

The surface-mount component 10C includes, on the back surface thereof and in three directions, two connection terminals 12a and 12c formed in the shape of a circle or a polygon and one connection terminal 12e being formed in the shape of a rectangle or an oval and having an area that is a sum of areas of the two connection terminals.

The circuit substrate 20C includes, on the front surface thereof and in the three directions, two electrode pads 22a and 22c formed in the shape of a circle or a polygon and one electrode pad 22e being formed in the shape of a rectangle or an oval and having an area that is a sum of areas of the two electrode pads.

The solder resist films 24a, 24c, and 24e as a part of the entire area resist film 25 are around the plurality of electrode pads 22a, 22c, and 22e.

The openings 30a, 30c, and 30e in the metal mask 30 for squeezing and applying the solders 31a, 31c, and 31e to the surfaces of the plurality of electrode pads 22a, 22c, and 22e are opposed to an entire area of exposed portions of the plurality of electrode pads 22a, 22c, and 22e without the solder resist films 24a, 24c, and 24e applied thereto.

The thickness dimension of the metal mask 30 is larger than the thickness dimension of the solder resist films 24a, 24c, and 24e. When the squeezed solders 31a, 31c, and 31e are molten, the thickness dimension of the solder material is reduced to a predetermined value and the solder material spreads on entire surfaces of the plurality of connection terminals 12a, 12c, and 12e, where the predetermined value is larger than the thickness dimension of the solder resist films 24a, 24c, and 24e.

As described above, with reference to claim 7, 17 of the present invention, as the connection terminals of the three-terminal surface-mount component and the electrode pads corresponding thereto of the circuit substrate, circular ones and square or oval ones are used in combination. The solder resist film is formed at the center of the three electrode pads. The openings in the metal mask are of the same dimension as that of the exposed surfaces of the electrode pads, but the molten solder is adapted to spread on the entire surfaces of the connection terminals.

Therefore, the molten solder goes around onto offset portions at which the electrode pads and the connection terminals do not mutually overlap, which can extend electrical connection surfaces between the electrode pads and the connection terminals, respectively.

Further, by setting the area of one of the three electrode pads and one of the three connection terminals corresponding thereto so as to be equivalent to the sum of the areas of the remaining two electrode pads and the remaining two connection terminals corresponding thereto, the mounting position of the surface-mount component can be, when offset, returned toward the center by the self-alignment effect.

Further, when solder non-wetting state of, among the one large electrode pad and the two small electrode pads, either of the two small ones or only the large one occurs, similarly to the case of the two-terminal surface-mount component, misregistration from the standard position indication marks occurs when soldering is performed, thereby enabling detection of abnormality. When solder non-wetting state of only one of the two small electrode pads occurs, the surface-mount component is tilted to cause misregistration from the standard position indication marks when soldering is performed, thereby enabling detection of abnormality.

The surface-mount component 10A, 10B, or 10C is a heat-generating component, which principally includes two power diodes or one power transistor, which is formed on a silicon substrate having a plane area of 1 mm² to 4 mm², and which includes a moisture-proof protective film as the cladding material 11.

The ratio L4/L3 between the overlapping dimension L3, which is a width of portions at which exposed portions of the plurality of electrode pads 22a, 22c, and 22e without the solder resist films 24a, 24c, and 24e applied thereto and the plurality of connection terminals 12a, 12c, and 12e at the reference relative position mutually overlap, and the non-overlapping dimension L4 of the plurality of connection terminals 12a, 12c, and 12e is from 1.1 to 0.9.

As described above, with reference to claims 8-12, 18-22 of the present invention, the surface-mount component is a small heat-generating component that is not encapsulated in resin, and the overlapping dimensions and the non-overlapping dimensions between the connection terminals and the electrode pads, respectively, are substantially the same.

Therefore, the electrode pads are formed using the back surface of the surface-mount component, and both the overlapping dimensions for securing the strength of the solder connection and the dimensions of movement toward the center in the case of solder non-wetting can be secured.

Further, heat generated by the surface-mount component is transferred from the connection terminals thereof to the electrode pads efficiently. The heat can be dissipated by transfer from the circuit substrate to the housing, and the heat can also be dissipated by radiation via the moisture-proof protective film into the housing.

Exemplary electronic components to be mounted include one power transistor, and two power diodes having one common terminal.

What is claimed is:

1. An electronic circuit device, comprising:
    a plurality of electrode pads formed on a front surface of a circuit substrate;
    a plurality of connection terminals formed on a back surface of a surface-mount component,
    wherein a first number of the plurality of connection terminals is equal to a second number of the plurality of electrode pads,
    wherein the plurality of electrode pads and the plurality of connection terminals are respectively connected with a solder that is heated,
    wherein the solder has a lead content of 0.1% or less in mass ratio, and
    wherein the plurality of connection terminals are not formed on a side end surface and on a front surface of the surface-mount component, and are formed on the back surface of the surface-mount component to be opposed to the front surface of the circuit substrate; and
    standard position indication marks formed on the front surface of the circuit substrate, at diagonal positions of the surface-mount component,
    wherein the standard position indication marks indicate a contour position of the surface-mount component as a reference relative position where the plurality of connection terminals are mounted at central positions of the plurality of electrode pads, respectively,
    wherein in order that, when a part of the solder applied to the plurality of electrode pads is lacked and a solder non-wetting state of one of a pair of electrode pads among the plurality of electrode pads occurs, an actual contour position of the surface-mount component becomes different from the contour position indicated by the standard position indication marks, one of a horizontal inter-electrode pitch L1x and a vertical inter-electrode pitch L1y of the plurality of electrode pads is smaller than a corresponding one of a horizontal inter-terminal pitch L2x and a vertical inter-terminal pitch L2y of the plurality of connection terminals, and
    wherein, when the surface-mount component is mounted at the reference relative position, an overlapping dimension L3 that is a first width of a first portion at which one of the plurality of electrode pads and one of the plurality of connection terminals mutually overlap, is greater than or equal to a first thickness dimension of the plurality of electrode pads, and a non-overlapping dimension L4 that is a second width of a second portion at which the one of the plurality of electrode pads and the one of the plurality of connection terminals do not mutually overlap, is larger than a visible minimum indication line width of the standard position indication marks.

2. The electronic circuit device according to claim 1, wherein the overlapping dimension L3 is a requirement for the solder applied to the plurality of electrode pads to be connected to the plurality of connection terminals and to be molten and spread on surfaces of the plurality of connection terminals, and
    wherein the non-overlapping dimension L4 is a maximum dimension by which the surface-mount component moves toward a center by a self-alignment effect when the solder non-wetting state occurs.

3. The electronic circuit device according to claim 2, further comprising a solder resist film covering non-soldered regions of the plurality of electrode pads and copper foil patterns connected to the plurality of electrode pads,
    wherein the solder resist film is a part of an entire area resist film for an entire area of the front surface of the circuit substrate,
    wherein the entire area resist film has a first color that is different from a second color of a base surface of the circuit substrate, and
    wherein the standard position indication marks are formed by leaving the entire area resist film unapplied and exposing a part of the base surface in a shape of hooks, or printing, on the entire area resist film that is applied, white hooks of a third color different from the first color of the entire area resist film.

4. The electronic circuit device according to claim 3, wherein the back surface of the surface-mount component includes a pair of connection terminals formed in a first shape of a rectangle and arranged in parallel with each other,
    wherein the front surface of the circuit substrate includes a pair of electrode pads formed in a second shape of the rectangle or a modified narrow rectangle with end portions of the modified narrow rectangle being rounded or chamfered, and arranged in parallel with each other,
    wherein the solder resist film is applied around the pair of electrode pads,
    wherein openings in a metal mask for squeezing and applying the solder to surfaces of the pair of electrode pads are opposed to an entire area over exposed portions of the pair of electrode pads to which the solder resist film is not applied, and
    wherein a second thickness dimension of the metal mask is larger than a third thickness dimension of the solder resist film so that when the solder that is squeezed is molten, a fourth thickness dimension of a solder material is reduced to a predetermined value and the solder material spreads on entire surfaces of the pair of connection terminals, the predetermined value being larger than the third thickness dimension of the solder resist film.

5. The electronic circuit device according to claim 3, wherein the back surface of the surface-mount component includes two pairs of connection terminals formed in a first shape of a circle or a polygon and arranged at vertices of a rectangle, wherein the front surface of the circuit substrate includes two pairs of electrode pads formed in a second shape of the circle or the polygon and arranged at the vertices of the rectangle, wherein the solder resist film is applied around the two pairs of electrode pads, wherein openings in a metal mask for squeezing and applying the solder to surfaces of the two pairs of electrode pads are opposed to an entire area over exposed portions of the two pairs of electrode pads to which the solder resist film is not applied, and wherein a second thickness dimension of the metal mask is larger than a third thickness dimension of the solder resist film so that when the solder that is squeezed is molten, a fourth thickness dimension of a solder material is reduced to a predetermined value and the solder material spreads on entire surfaces of the two pairs of connection terminals, the predetermined value being larger than the third thickness dimension of the solder resist film.

6. The electronic circuit device according to claim 5, wherein, in the two pairs of electrode pads, the horizontal inter-electrode pitch L1$x$ between a first pair of electrode pads arranged along a horizontal axis is equal to the horizontal inter-electrode pitch L1$x$ between a first remaining pair of electrode pads, and the vertical inter-electrode pitch L1$y$ between a second pair of electrode pads arranged along a vertical axis is equal to the vertical inter-electrode pitch L1$y$ between a second remaining pair of electrode pads, wherein, in the two pairs of connection terminals, the horizontal inter-terminal pitch L2$x$ between a third pair of connection terminals arranged along the horizontal axis is equal to the horizontal inter-terminal pitch L2$x$ between a remaining third pair of connection terminals, and the vertical inter-terminal pitch L2$y$ between a fourth pair of connection terminals arranged along the vertical axis and the vertical inter-terminal pitch L2$y$ between a fourth remaining pair of connection terminals, and wherein in order that, the part of the solder applied to the plurality of electrode pads is lacked and the solder non-wetting state occurs, the actual contour position of the surface-mount component becomes different from the contour position indicated by the standard position indication marks, the horizontal inter-electrode pitch L1$x$ and the vertical inter-electrode pitch L1$y$ are smaller than the horizontal inter-terminal pitch L2$x$ and the vertical inter-terminal pitch L2$y$, respectively, and a first ratio L1$x$/L1$y$ between the horizontal inter-electrode pitch L1$x$ and the vertical inter-electrode pitch L1$y$ and a second ratio L2$x$/L2$y$ between the horizontal inter-terminal pitch L2$x$ and the vertical inter-terminal pitch L2$y$ are set to have different values.

7. The electronic circuit device according to claim 3, wherein the back surface of the surface-mount component includes, in three directions, two connection terminals formed in a first shape of a circle or a polygon, and one connection terminal formed in a second shape of a rectangle or an oval and having a first sum area of the two connection terminals, wherein the front surface of the circuit substrate includes, in the three directions, two electrode pads formed in a third shape of one of the circle and the polygon, and one electrode pad being formed in a fourth shape of one of the rectangle and the oval and having a second sum area of the two electrode pads, wherein the solder resist film is applied around the two electrode pads and the one electrode pad, wherein openings in a metal mask for squeezing and applying the solder to surfaces of the two electrode pads and the one electrode pad are opposed to an entire area of exposed portions of the two electrode pads and the one electrode pad to which the solder resist film is not applied, and wherein a second thickness dimension of the metal mask is larger than a third thickness dimension of the solder resist film so that when the solder that is squeezed is molten, a fourth thickness dimension of a solder material is reduced to a predetermined value and the solder material spreads on entire surfaces of the two connection terminals and the one connection terminal, the predetermined value being larger than the third thickness dimension of the solder resist film.

8. The electronic circuit device according to claim 3, wherein the surface-mount component comprises a heat-generating component including one power diode, two power diodes, or one power transistor that is formed on a silicon substrate having a plane area of 1 mm$^2$ to 4 mm$^2$, and including a moisture-proof protective film, wherein a ratio L4/L3 between the overlapping dimension L3 and the non-overlapping dimension L4 of the plurality of connection terminals is from 1.1 to 0.9, and wherein the overlapping dimension L3 is the first width of the first portion at which an exposed portion of the one of the plurality of electrode pads to which the solder resist film is not applied mutually overlaps the one of the plurality of connection terminals at the reference relative position.

9. The electronic circuit device according to claim 4, wherein the surface-mount component comprises a heat-generating component including one power diode, two power diodes, or one power transistor that is formed on a silicon substrate having a plane area of 1 mm$^2$ to 4 mm$^2$, and including a moisture-proof protective film, wherein a ratio L4/L3 between the overlapping dimension L3 and the non-overlapping dimension L4 of the plurality of connection terminals is from 1.1 to 0.9, and wherein the overlapping dimension L3 is the first width of the first portion at which an exposed portion of the one of the plurality of electrode pads to which the solder resist film is not applied mutually overlaps the one of the plurality of connection terminals at the reference relative position.

10. The electronic circuit device according to claim 5, wherein the surface-mount component comprises a heat-generating component including one power diode, two power diodes, or one power transistor that is formed on a silicon substrate having a plane area of 1 mm$^2$ to 4 mm$^2$, and including a moisture-proof protective film, wherein a ratio L4/L3 between the overlapping dimension L3 and the non-overlapping dimension L4 of the plurality of connection terminals is from 1.1 to 0.9; and wherein the overlapping dimension L3 is the first width of the first portion at which an exposed portion of the one of the plurality of electrode pads to which the solder resist film is not applied mutually overlaps the one of the plurality of connection terminals at the reference relative position.

11. The electronic circuit device according to claim 6, wherein the surface-mount component comprises a heat-generating component including one power diode, two power diodes, or one power transistor that is formed on a silicon substrate having a plane area of 1 mm² to 4 mm², and including a moisture-proof protective film,
  wherein a ratio L4/L3 between the overlapping dimension L3 and the non-overlapping dimension L4 of the plurality of connection terminals is from 1.1 to 0.9, and
  wherein the overlapping dimension L3 is the first width of the first portion at which an exposed portion of the one of the plurality of electrode pads to which the solder resist film is not applied mutually overlaps the one of the plurality of connection terminals at the reference relative position.

12. The electronic circuit device according to claim 7, wherein the surface-mount component comprises a heat-generating component including one power diode, two power diodes, or one power transistor that is formed on a silicon substrate having a plane area of 1 mm² to 4 mm², and including a moisture-proof protective film,
  wherein a ratio L4/L3 between the overlapping dimension L3 and the non-overlapping dimension L4 of the plurality of connection terminals is from 1.1 to 0.9, and
  wherein the overlapping dimension L3 is the first width of the first portion at which an exposed portion of the one of the plurality of electrode pads to which the solder resist film is not applied mutually overlaps the one of the plurality of connection terminals at the reference relative position.

13. The electronic circuit device according to claim 1, further comprising a solder resist film covering non-soldered regions of the plurality of electrode pads and copper foil patterns connected to the plurality of electrode pads,
  wherein the solder resist film is a part of an entire area resist film for an entire area of the front surface of the circuit substrate,
  wherein the entire area resist film has a first color that is different from a second color of a base surface of the circuit substrate, and
  wherein the standard position indication marks are formed by leaving the entire area resist film unapplied and exposing apart of the base surface in a shape of hooks, or printing, on the entire area resist film that is applied, white hooks of a third color different from the first color of the entire area resist film.

14. The electronic circuit device according to claim 13, wherein the back surface of the surface-mount component includes a pair of connection terminals formed in a first shape of a rectangle and arranged in parallel with each other,
  wherein the front surface of the circuit substrate includes a pair of electrode pads formed in a second shape of the rectangle or a modified narrow rectangle with end portions of the modified narrow rectangle being rounded or chamfered, and arranged in parallel with each other,
  wherein the solder resist film is applied around the pair of electrode pads,
  wherein openings in a metal mask for squeezing and applying the solder to surfaces of the pair of electrode pads are opposed to an entire area over exposed portions of the pair of electrode pads to which the solder resist film is no applied, and
  wherein a second thickness dimension of the metal mask is larger than a third thickness dimension of the solder resist film so that when the solder that is squeezed is molten, a fourth thickness dimension of a solder material is reduced to a predetermined value and the solder material spreads on entire surfaces of the pair of connection terminals, the predetermined value being larger than the third thickness dimension of the solder resist film.

15. The electronic circuit device according to claim 13, wherein the back surface of the surface-mount component includes two pairs of connection terminals formed in a first shape of a circle or a polygon and arranged at vertices of a rectangle,
  wherein the front surface of the circuit substrate includes two pairs of electrode pads formed in a second shape of the circle or the polygon and arranged at the vertices of the rectangle,
  wherein the solder resist film is applied around the two pairs of electrode pads,
  wherein openings in a metal mask for squeezing and applying the solder to surfaces of the two pairs of electrode pads are opposed to an entire area over exposed portions of the two pairs of electrode pads to which the solder resist film is not applied, and
  wherein a second thickness dimension of the metal mask is larger than a third thickness dimension of the solder resist film so that when the solder that is squeezed is molten, a fourth thickness dimension of a solder material is reduced to a predetermined value and the solder material spreads on entire surfaces of the two pairs of connection terminals, the predetermined value being larger than the third thickness dimension of the solder resist film.

16. The electronic circuit device according to claim 15, wherein, in the two pairs of electrode pads, the horizontal inter-electrode pitch $L1x$ between a first pair of electrode pads arranged along a horizontal axis is equal to the horizontal inter-electrode pitch $L1x$ between a first remaining pair of electrode pads, and the vertical inter-electrode pitch $L1y$ between a second pair of electrode pads arranged along a vertical axis is equal to the vertical inter-electrode pitch $L1y$ between a second remaining pair of electrode pads,
  wherein, in the two pairs of connection terminals, the horizontal inter-terminal pitch $L2x$ between a third pair of connection terminals arranged along the horizontal axis is equal to the horizontal inter-terminal pitch $L2x$ between a remaining third pair of connection terminals, and the vertical inter-terminal pitch $L2y$ between a fourth pair of connection terminals arranged along the vertical axis and the vertical inter-terminal pitch $L2y$ between a fourth remaining pair of connection terminals, and
  wherein in order that, when the part of the solder applied to the plurality of electrode pads is lacked and the solder non-wetting state occurs, the actual contour position of the surface-mount component becomes different from the contour position indicated by the standard position indication marks, the horizontal inter-electrode pitch $L1x$ and the vertical inter-electrode pitch $L1y$ are smaller than the horizontal inter-terminal pitch $L2x$ and the vertical inter-terminal pitch $L2y$, respectively, and a first ratio $L1x/L1y$ between the horizontal inter-electrode pitch $L1x$ and the vertical inter-electrode pitch $L1y$ and a second ratio $L2x/L2y$ between the horizontal inter-terminal pitch $L2x$ and the vertical inter-terminal pitch $L2y$ are set to have different values.

17. The electronic circuit device according to claim 13, wherein the back surface of the surface-mount component includes, in three directions, two connection terminals formed in a first shape of a circle or a polygon, and one connection terminal formed in a second shape of a rectangle or an oval and having a first sum area of the two connection terminals,
    wherein the front surface of the circuit substrate includes, in the three directions, two electrode pads formed in a third shape of one of the circle and the polygon, and one electrode pad being formed in a fourth shape of one of the rectangle and the oval and having a second sum area of the two electrode pads,
    wherein the solder resist film is applied around the two electrode pads and the one electrode pad,
    wherein openings in a metal mask for squeezing and applying the solder to surfaces of the two electrode pads and the one electrode pad are opposed to an entire area of exposed portions of the two electrode pads and the one electrode pad to which the solder resist film is not applied, and
    wherein a second thickness dimension of the metal mask is larger than a third thickness dimension of the solder resist film so that when the solder that is squeezed is molten, a fourth thickness dimension of a solder material is reduced to a predetermined value and the solder material spreads on entire surfaces of the two connection terminals and the one connection terminal, the predetermined value being larger than the third thickness dimension of the solder resist film.

18. The electronic circuit device according to claim 13, wherein the surface-mount component comprises a heat-generating component including one power diode, two power diodes, or one power transistor that is formed on a silicon substrate having a plane area of 1 mm$^2$ to 4 mm$^2$, and including a moisture-proof protective film,
    wherein a ratio L4/L3 between the overlapping dimension L3 and the non-overlapping dimension L4 of the plurality of connection terminals is from 1.1 to 0.9, and
    wherein the overlapping dimension L3 is the first width of the first portion at which an exposed portion of the one of the plurality of electrode pads to which the solder resist film is not applied mutually overlaps the one of the plurality of connection terminals at the reference relative position.

19. The electronic circuit device according to claim 14, wherein the surface-mount component comprises a heat-generating component including one power diode, two power diodes, or one power transistor that is formed on a silicon substrate having a plane area of 1 mm$^2$ to 4 mm$^2$, and including a moisture-proof protective film,
    wherein a ratio L4/L3 between the overlapping dimension L3 and the non-overlapping dimension L4 of the plurality of connection terminals is from 1.1 to 0.9, and
    wherein the overlapping dimension L3 is the first width of the first portion at which an exposed portion of the one of the plurality of electrode pads to which the solder resist film is not applied mutually overlaps the one of the plurality of connection terminals at the reference relative position.

20. The electronic circuit device according to claim 15, wherein the surface-mount component comprises a heat-generating component including one power diode, two power diodes, or one power transistor that is formed on a silicon substrate having a plane area of 1 mm$^2$ to 4 mm$^2$, and including a moisture-proof protective film,
    wherein a ratio L4/L3 between the overlapping dimension L3 and the non-overlapping dimension L4 of the plurality of connection terminals is from 1.1 to 0.9, and
    wherein the overlapping dimension L3 is the first width of the first portion at which an exposed portion of the one of the plurality of electrode pads to which the solder resist film is not applied mutually overlaps the one of the plurality of connection terminals at the reference relative position.

21. The electronic circuit device according to claim 16, wherein the surface-mount component comprises a heat-generating component including one power diode, two power diodes, or one power transistor that is formed on a silicon substrate having a plane area of 1 mm$^2$ to 4 mm$^2$, and including a moisture-proof protective film,
    wherein a ratio L4/L3 between the overlapping dimension L3 and the non-overlapping dimension L4 of the plurality of connection terminals is from 1.1 to 0.9, and
    wherein the overlapping dimension L3 is the first width of the first portion at which an exposed portion of the one of the plurality of electrode pads to which the solder resist film is not applied mutually overlaps the one of the plurality of connection terminals at the reference relative position.

22. The electronic circuit device according to claim 17, wherein the surface-mount component comprises a heat-generating component including one power diode, two power diodes, or one power transistor that is formed on a silicon substrate having a plane area of 1 mm$^2$ to 4 mm$^2$, and including a moisture-proof protective film,
    wherein a ratio L4/L3 between the overlapping dimension L3 and the non-overlapping dimension L4 of the plurality of connection terminals is from 1.1 to 0.9, and
    wherein the overlapping dimension L3 is the first width of the first portion at which an exposed portion of the one of the plurality of electrode pads to which the solder resist film is not applied mutually overlaps the one of the plurality of connection terminals at the reference relative position.

\* \* \* \* \*